(12) United States Patent
Wieland et al.

(10) Patent No.: US 11,186,060 B2
(45) Date of Patent: Nov. 30, 2021

(54) METHODS OF CONTINUOUS FABRICATION OF HOLES IN FLEXIBLE SUBSTRATE SHEETS AND PRODUCTS RELATING TO THE SAME

(71) Applicant: CORNING INCORPORATED, Corning, NY (US)

(72) Inventors: Kristopher Allen Wieland, Painted Post, NY (US); Garrett Andrew Piech, Corning, NY (US); John Tyler Keech, Painted Post, NY (US); Jeffrey Mathew Clark, Corning, NY (US)

(73) Assignee: Corning Incorporated, Corning, NY (US)

( * ) Notice: Subject to any disclaimer, the term of this patent is extended or adjusted under 35 U.S.C. 154(b) by 916 days.

(21) Appl. No.: 15/205,284

(22) Filed: Jul. 8, 2016

(65) Prior Publication Data

US 2017/0008122 A1 Jan. 12, 2017

Related U.S. Application Data

(60) Provisional application No. 62/190,823, filed on Jul. 10, 2015.

(51) Int. Cl.
  *B32B 3/26* (2006.01)
  *B32B 17/06* (2006.01)
  (Continued)

(52) U.S. Cl.
  CPC .......... *B32B 3/266* (2013.01); *B23K 26/0604* (2013.01); *B23K 26/53* (2015.10);
  (Continued)

(58) Field of Classification Search
  CPC .... B23K 26/384; B23K 26/402; B23K 26/04; B23K 26/0624; B23K 26/0057;
  (Continued)

(56) References Cited

U.S. PATENT DOCUMENTS

| | | |
|---|---|---|
| 1,790,397 A | 1/1931 | Woods et al. |
| 2,682,134 A | 6/1954 | Stookey |

(Continued)

FOREIGN PATENT DOCUMENTS

| | | |
|---|---|---|
| CN | 1259924 A | 7/2000 |
| CN | 2388062 Y | 7/2000 |

(Continued)

OTHER PUBLICATIONS

ICNIRP, Infrared Radiation, https://www.icnirp.org/en/frequencies/infrared/index.html#:~:text-Wavelength, accessed Apr. 7, 2021 (Year: 2014).*

(Continued)

*Primary Examiner* — Jacob T Minskey
*Assistant Examiner* — S. Behrooz Ghorishi
(74) *Attorney, Agent, or Firm* — Amy T. Lang

(57) ABSTRACT

Systems and processes of cutting and drilling in a target substrate uses a laser (e.g., a pulsed laser) and an optical system to generate a line focus of the laser beam within the target substrate, such as a glass substrate sheet, are provided. The laser cutting and drilling system and process creates holes or defects that, in certain embodiments, extend the full depth of the glass sheet with each individual laser pulse, and allows the laser system to cut and separate the target substrate into any desired contour by creating a series of perforations that form a contour or desired part shape. Since a glass substrate sheet is brittle, cracking will then follow the perforated contour, allowing the glass substrate sheet to separate into any required shape defined by the perforations.

24 Claims, 14 Drawing Sheets

(51) Int. Cl.
*B23K 26/53* (2014.01)
*C03C 15/00* (2006.01)
*H01L 23/498* (2006.01)
*H01L 21/48* (2006.01)
*H01L 23/15* (2006.01)
*C03B 33/02* (2006.01)
*C03C 17/06* (2006.01)
*B23K 26/06* (2014.01)
*B23K 103/00* (2006.01)

(52) U.S. Cl.
CPC .......... *B32B 17/06* (2013.01); *C03B 33/0222* (2013.01); *C03C 15/00* (2013.01); *C03C 17/06* (2013.01); *H01L 21/486* (2013.01); *H01L 23/15* (2013.01); *H01L 23/49827* (2013.01); *B23K 2103/54* (2018.08); *B32B 2307/412* (2013.01); *Y02P 40/57* (2015.11)

(58) Field of Classification Search
CPC ............ B23K 26/0613; B23K 26/0617; B23K 26/38; B23K 26/006; C03B 33/0222; C03B 33/091; C03C 17/00; C03C 15/00; C03C 2217/70; B32B 17/064; C09K 13/00; Y02P 40/57; Y10T 428/24273; Y10T 428/24322
See application file for complete search history.

(56) References Cited

U.S. PATENT DOCUMENTS

| | | |
|---|---|---|
| 2,749,794 A | 6/1956 | O'Leary |
| 3,647,410 A | 3/1972 | Heaton et al. |
| 3,695,497 A | 10/1972 | Dear |
| 3,695,498 A | 10/1972 | Dear |
| 3,729,302 A | 4/1973 | Heaton |
| 3,775,084 A | 11/1973 | Heaton |
| 4,226,607 A | 10/1980 | Domken |
| 4,441,008 A | 4/1984 | Chan |
| 4,546,231 A | 10/1985 | Gresser et al. |
| 4,646,308 A | 2/1987 | Kafka et al. |
| 4,764,930 A | 8/1988 | Bille et al. |
| 4,891,054 A | 1/1990 | Bricker et al. |
| 4,907,586 A | 3/1990 | Bille et al. |
| 4,918,751 A | 4/1990 | Pessot et al. |
| 4,929,065 A | 5/1990 | Hagerty et al. |
| 5,035,918 A | 7/1991 | Vyas |
| 5,040,182 A | 8/1991 | Spinelli et al. |
| 5,104,210 A | 4/1992 | Tokas |
| 5,104,523 A | 4/1992 | Masaharu et al. |
| 5,108,857 A | 4/1992 | Kitayama et al. |
| 5,112,722 A | 5/1992 | Tsujino et al. |
| 5,114,834 A | 5/1992 | Nachshon |
| 5,265,107 A | 11/1993 | Delfyett, Jr. |
| 5,400,350 A | 3/1995 | Galvanauskas |
| 5,410,567 A | 4/1995 | Brundage et al. |
| 5,418,803 A | 5/1995 | Zhiglinsky et al. |
| 5,434,875 A | 7/1995 | Rieger et al. |
| 5,436,925 A | 7/1995 | Lin et al. |
| 5,521,352 A | 5/1996 | Lawson |
| 5,553,093 A | 9/1996 | Ramaswamy et al. |
| 5,574,597 A | 11/1996 | Kataoka et al. |
| 5,578,229 A | 11/1996 | Barnekov et al. |
| 5,586,138 A | 12/1996 | Yokoyama |
| 5,696,782 A | 12/1997 | Harter et al. |
| 5,715,346 A | 2/1998 | Liu |
| 5,736,061 A | 4/1998 | Fukada et al. |
| 5,736,709 A | 4/1998 | Neiheisel |
| 5,776,220 A | 7/1998 | Allaire et al. |
| 5,781,684 A | 7/1998 | Liu |
| 6,016,223 A | 1/2000 | Suzuki et al. |
| 6,016,324 A | 1/2000 | Rieger et al. |
| 6,038,055 A | 3/2000 | Hänsch et al. |
| 6,055,829 A | 5/2000 | Witzmann et al. |
| 6,078,599 A | 6/2000 | Everage et al. |
| 6,156,030 A | 12/2000 | Neev |
| 6,160,835 A | 12/2000 | Kwon |
| 6,186,384 B1 | 2/2001 | Sawada |
| 6,210,401 B1 | 4/2001 | Lai |
| 6,256,328 B1 | 7/2001 | Delfyett et al. |
| 6,259,058 B1 | 7/2001 | Hoekstra |
| 6,259,151 B1 | 7/2001 | Morrison |
| 6,259,512 B1 | 7/2001 | Mizouchi |
| 6,272,156 B1 | 8/2001 | Reed et al. |
| 6,301,932 B1 | 10/2001 | Allen et al. |
| 6,322,958 B1 | 11/2001 | Hayashi |
| 6,339,208 B1 | 1/2002 | Rockstroh et al. |
| 6,373,565 B1 | 4/2002 | Kafka et al. |
| 6,381,391 B1 | 4/2002 | Islam et al. |
| 6,396,856 B1 | 5/2002 | Sucha et al. |
| 6,407,360 B1 | 6/2002 | Choo et al. |
| 6,438,996 B1 | 8/2002 | Cuvelier |
| 6,445,491 B2 | 9/2002 | Sucha et al. |
| 6,449,301 B1 | 9/2002 | Wu et al. |
| 6,484,052 B1 | 11/2002 | Visuri et al. |
| 6,489,589 B1 | 12/2002 | Alexander |
| 6,501,578 B1 | 12/2002 | Bernstein et al. |
| 6,552,301 B2 | 4/2003 | Herman et al. |
| 6,573,026 B1 | 6/2003 | Aitken et al. |
| 6,592,703 B1 | 7/2003 | Habeck et al. |
| 6,635,849 B1 | 10/2003 | Okawa et al. |
| 6,635,850 B2 | 10/2003 | Amako et al. |
| 6,720,519 B2 | 4/2004 | Liu et al. |
| 6,729,161 B1 | 5/2004 | Miura et al. |
| 6,737,345 B1 | 5/2004 | Lin et al. |
| 6,787,732 B1 | 9/2004 | Xuan et al. |
| 6,800,237 B1 | 10/2004 | Yamamoto et al. |
| 6,800,831 B1 | 10/2004 | Hoetzel |
| 6,958,094 B2 | 10/2005 | Ohmi et al. |
| 6,992,026 B2 | 1/2006 | Fukuyo et al. |
| 7,009,138 B2 | 3/2006 | Amako et al. |
| 7,061,583 B2 | 6/2006 | Mulkens et al. |
| 7,353,829 B1 | 4/2008 | Wachter et al. |
| 7,511,886 B2 | 3/2009 | Schultz et al. |
| 7,535,634 B1 | 5/2009 | Savchenkov et al. |
| 7,633,033 B2 | 12/2009 | Thomas et al. |
| 7,642,483 B2 | 1/2010 | You et al. |
| 7,649,153 B2 | 1/2010 | Haight et al. |
| 7,726,532 B2 | 6/2010 | Gonoe |
| 8,104,385 B2 | 1/2012 | Hayashi et al. |
| 8,118,971 B2 | 2/2012 | Hori et al. |
| 8,132,427 B2 | 3/2012 | Brown et al. |
| 8,168,514 B2 | 5/2012 | Garner et al. |
| 8,245,539 B2 | 8/2012 | Lu et al. |
| 8,245,540 B2 | 8/2012 | Abramov et al. |
| 8,269,138 B2 | 9/2012 | Garner et al. |
| 8,283,595 B2 | 10/2012 | Fukuyo et al. |
| 8,292,141 B2 | 10/2012 | Cox et al. |
| 8,296,066 B2 | 10/2012 | Zhao et al. |
| 8,327,666 B2 | 12/2012 | Harvey et al. |
| 8,341,976 B2 | 1/2013 | Dejneka et al. |
| 8,347,651 B2 | 1/2013 | Abramov et al. |
| 8,358,888 B2 | 1/2013 | Ramachandran |
| 8,444,906 B2 | 5/2013 | Lee et al. |
| 8,448,471 B2 | 5/2013 | Kumatani et al. |
| 8,518,280 B2 | 8/2013 | Hsu et al. |
| 8,549,881 B2 | 10/2013 | Brown et al. |
| 8,584,354 B2 | 11/2013 | Cornejo et al. |
| 8,584,490 B2 | 11/2013 | Garner et al. |
| 8,592,716 B2 | 11/2013 | Abramov et al. |
| 8,604,380 B2 | 12/2013 | Howerton et al. |
| 8,607,590 B2 | 12/2013 | Glaesemann et al. |
| 8,616,024 B2 | 12/2013 | Cornejo et al. |
| 8,635,887 B2 | 1/2014 | Black et al. |
| 8,680,489 B2 | 3/2014 | Martinez et al. |
| 8,685,838 B2 | 4/2014 | Fukuyo et al. |
| 8,697,228 B2 | 4/2014 | Carre et al. |
| 8,720,228 B2 | 5/2014 | Li |
| 8,826,696 B2 | 9/2014 | Brown et al. |
| 8,842,358 B2 | 9/2014 | Bareman et al. |
| 8,852,698 B2 | 10/2014 | Fukumitsu |
| 8,887,529 B2 | 11/2014 | Lu et al. |
| 8,916,798 B2 | 12/2014 | Plüss |

(56) References Cited

U.S. PATENT DOCUMENTS

| | | |
|---|---|---|
| 8,943,855 B2 | 2/2015 | Gomez et al. |
| 8,971,053 B2 | 3/2015 | Kariya et al. |
| 9,138,913 B2 | 9/2015 | Arai et al. |
| 9,227,868 B2 | 1/2016 | Matsumoto et al. |
| 9,290,407 B2 | 3/2016 | Barefoot et al. |
| 9,296,066 B2 | 3/2016 | Hosseini et al. |
| 9,324,791 B2 | 4/2016 | Tamemoto |
| 9,327,381 B2 | 5/2016 | Lee et al. |
| 9,446,590 B2 | 9/2016 | Chen et al. |
| 9,481,598 B2 | 11/2016 | Bergh et al. |
| 9,878,304 B2 | 1/2018 | Kotake et al. |
| 10,730,783 B2 | 8/2020 | Akarapu et al. |
| 2001/0027842 A1 | 10/2001 | Curcio et al. |
| 2002/0006765 A1 | 1/2002 | Michel et al. |
| 2002/0046997 A1 | 4/2002 | Nam et al. |
| 2002/0082466 A1 | 6/2002 | Han |
| 2002/0097486 A1 | 7/2002 | Yamaguchi et al. |
| 2002/0110639 A1 | 8/2002 | Bruns |
| 2003/0006221 A1 | 1/2003 | Hong et al. |
| 2003/0007772 A1 | 1/2003 | Borrelli et al. |
| 2004/0221615 A1 | 11/2004 | Postupack et al. |
| 2005/0024743 A1 | 2/2005 | Camy-Peyret |
| 2005/0098458 A1 | 5/2005 | Gruetzmacher et al. |
| 2005/0098548 A1 | 5/2005 | Kobayashi et al. |
| 2005/0115938 A1 | 6/2005 | Sawaki et al. |
| 2005/0274702 A1 | 12/2005 | Deshi |
| 2006/0011593 A1 | 1/2006 | Fukuyo |
| 2006/0109874 A1 | 5/2006 | Shiozaki et al. |
| 2006/0127679 A1 | 6/2006 | Gulati et al. |
| 2006/0213883 A1 | 9/2006 | Eberhardt et al. |
| 2006/0227440 A1 | 10/2006 | Gluckstad |
| 2006/0289410 A1 | 12/2006 | Morita et al. |
| 2007/0021548 A1 | 1/2007 | Hattori et al. |
| 2007/0044606 A1 | 3/2007 | Kang et al. |
| 2007/0053632 A1 | 3/2007 | Popp |
| 2007/0090180 A1 | 4/2007 | Griffis et al. |
| 2007/0111390 A1 | 5/2007 | Komura et al. |
| 2007/0111480 A1 | 5/2007 | Maruyama et al. |
| 2007/0119831 A1 | 5/2007 | Kandt |
| 2007/0132977 A1 | 6/2007 | Komatsuda |
| 2007/0138151 A1 | 6/2007 | Tanaka et al. |
| 2007/0177116 A1 | 8/2007 | Amako |
| 2007/0202619 A1 | 8/2007 | Tamura et al. |
| 2007/0298529 A1 | 12/2007 | Maeda et al. |
| 2008/0000884 A1 | 1/2008 | Sugiura et al. |
| 2008/0099444 A1 | 5/2008 | Misawa et al. |
| 2008/0190981 A1 | 8/2008 | Okajima et al. |
| 2008/0310465 A1 | 12/2008 | Achtenhagen |
| 2009/0013724 A1 | 1/2009 | Koyo et al. |
| 2009/0104721 A1 | 4/2009 | Hirakata et al. |
| 2009/0157341 A1 | 6/2009 | Cheung |
| 2009/0176034 A1 | 7/2009 | Ruuttu et al. |
| 2009/0183764 A1 | 7/2009 | Meyer |
| 2009/0184849 A1 | 7/2009 | Nasiri et al. |
| 2009/0199694 A1 | 8/2009 | Uh et al. |
| 2009/0250446 A1 | 10/2009 | Sakamoto |
| 2009/0294419 A1 | 12/2009 | Abramov et al. |
| 2009/0294422 A1 | 12/2009 | Lubatschowski et al. |
| 2009/0324899 A1 | 12/2009 | Feinstein et al. |
| 2010/0020304 A1 | 1/2010 | Soer et al. |
| 2010/0024865 A1 | 2/2010 | Shah et al. |
| 2010/0025387 A1 | 2/2010 | Arai et al. |
| 2010/0029460 A1 | 2/2010 | Shojiya et al. |
| 2010/0032087 A1 | 2/2010 | Takahashi et al. |
| 2010/0086741 A1 | 4/2010 | Bovatsek et al. |
| 2010/0089631 A1 | 4/2010 | Sakaguchi et al. |
| 2010/0089882 A1 | 4/2010 | Tamura |
| 2010/0102042 A1 | 4/2010 | Garner et al. |
| 2010/0129603 A1 | 5/2010 | Blick et al. |
| 2010/0145620 A1 | 6/2010 | Georgi et al. |
| 2010/0147813 A1 | 6/2010 | Lei et al. |
| 2010/0252540 A1 | 10/2010 | Lei et al. |
| 2010/0252959 A1 | 10/2010 | Lei et al. |
| 2010/0276505 A1 | 11/2010 | Smith |
| 2010/0279067 A1 | 11/2010 | Sabia et al. |
| 2010/0287991 A1 | 11/2010 | Brown et al. |
| 2010/0320179 A1 | 12/2010 | Morita et al. |
| 2010/0326138 A1 | 12/2010 | Kumatani et al. |
| 2011/0023298 A1 | 2/2011 | Chujo et al. |
| 2011/0049765 A1 | 3/2011 | Li et al. |
| 2011/0088324 A1 | 4/2011 | Wessel |
| 2011/0100401 A1 | 5/2011 | Fiorentini |
| 2011/0127244 A1 | 6/2011 | Li |
| 2011/0132881 A1 | 6/2011 | Liu |
| 2011/0177325 A1* | 7/2011 | Tomamoto ............ B65H 18/28 428/332 |
| 2011/0183116 A1 | 7/2011 | Hung et al. |
| 2011/0191024 A1 | 8/2011 | Deluca |
| 2011/0238308 A1 | 9/2011 | Miller et al. |
| 2011/0240476 A1 | 10/2011 | Wang et al. |
| 2011/0240611 A1 | 10/2011 | Sandström et al. |
| 2011/0240617 A1 | 10/2011 | Xu et al. |
| 2011/0277507 A1 | 11/2011 | Lu et al. |
| 2011/0318555 A1 | 12/2011 | Bookbinder et al. |
| 2012/0017642 A1 | 1/2012 | Teranishi et al. |
| 2012/0047951 A1 | 3/2012 | Dannoux et al. |
| 2012/0048604 A1 | 3/2012 | Cornejo et al. |
| 2012/0061440 A1 | 3/2012 | Roell |
| 2012/0064306 A1 | 3/2012 | Kang et al. |
| 2012/0103018 A1 | 5/2012 | Lu et al. |
| 2012/0106117 A1 | 5/2012 | Sundaram et al. |
| 2012/0131962 A1 | 5/2012 | Mitsugi et al. |
| 2012/0135195 A1 | 5/2012 | Glaesemann et al. |
| 2012/0135607 A1 | 5/2012 | Shimoi et al. |
| 2012/0135608 A1 | 5/2012 | Shimoi et al. |
| 2012/0145331 A1 | 6/2012 | Gomez et al. |
| 2012/0196071 A1 | 8/2012 | Cornejo et al. |
| 2012/0234049 A1 | 9/2012 | Bolton |
| 2012/0234807 A1 | 9/2012 | Sercel et al. |
| 2012/0255935 A1 | 10/2012 | Kakui et al. |
| 2012/0299219 A1 | 11/2012 | Shimoi et al. |
| 2012/0302139 A1 | 11/2012 | Darcangelo et al. |
| 2013/0019637 A1 | 1/2013 | Sol et al. |
| 2013/0031879 A1 | 2/2013 | Yoshikane et al. |
| 2013/0034688 A1 | 2/2013 | Koike et al. |
| 2013/0044371 A1 | 2/2013 | Rupp et al. |
| 2013/0068736 A1 | 3/2013 | Mielke et al. |
| 2013/0075480 A1 | 3/2013 | Yokogi et al. |
| 2013/0078891 A1 | 3/2013 | Lee et al. |
| 2013/0091897 A1 | 4/2013 | Fugii et al. |
| 2013/0122264 A1 | 5/2013 | Fujii et al. |
| 2013/0126573 A1* | 5/2013 | Hosseini ............ B23K 26/0057 225/2 |
| 2013/0129947 A1 | 5/2013 | Harvey et al. |
| 2013/0133367 A1 | 5/2013 | Abramov et al. |
| 2013/0143416 A1 | 6/2013 | Norval |
| 2013/0149434 A1 | 6/2013 | Oh et al. |
| 2013/0149494 A1 | 6/2013 | Koike et al. |
| 2013/0167590 A1 | 7/2013 | Teranishi et al. |
| 2013/0174607 A1 | 7/2013 | Wootton et al. |
| 2013/0174610 A1 | 7/2013 | Teranishi et al. |
| 2013/0180285 A1 | 7/2013 | Kariya |
| 2013/0189806 A1 | 7/2013 | Hoshino |
| 2013/0192305 A1 | 8/2013 | Black et al. |
| 2013/0209731 A1 | 8/2013 | Nattermann et al. |
| 2013/0220982 A1 | 8/2013 | Thomas et al. |
| 2013/0221053 A1 | 8/2013 | Zhang |
| 2013/0224439 A1 | 8/2013 | Zhang et al. |
| 2013/0228918 A1* | 9/2013 | Chen ................ H01L 23/49811 257/737 |
| 2013/0247615 A1* | 9/2013 | Boek ...................... C03C 15/00 65/29.1 |
| 2013/0266757 A1 | 10/2013 | Giron et al. |
| 2013/0270240 A1 | 10/2013 | Kondo |
| 2013/0280495 A1 | 10/2013 | Matsumoto |
| 2013/0288010 A1 | 10/2013 | Akarapu et al. |
| 2013/0291598 A1 | 11/2013 | Saito et al. |
| 2013/0312460 A1 | 11/2013 | Kunishi et al. |
| 2013/0323469 A1 | 12/2013 | Abramov et al. |
| 2013/0334185 A1 | 12/2013 | Nomaru |
| 2013/0340480 A1 | 12/2013 | Nattermann et al. |
| 2014/0023087 A1 | 1/2014 | Czompo |
| 2014/0027951 A1 | 1/2014 | Srinivas et al. |
| 2014/0034730 A1 | 2/2014 | Lee |

(56) References Cited

U.S. PATENT DOCUMENTS

| | | |
|---|---|---|
| 2014/0042202 A1 | 2/2014 | Lee |
| 2014/0047957 A1 | 2/2014 | Wu |
| 2014/0076869 A1 | 3/2014 | Lee et al. |
| 2014/0102146 A1 | 4/2014 | Saito et al. |
| 2014/0110040 A1 | 4/2014 | Cok |
| 2014/0113797 A1 | 4/2014 | Yamada et al. |
| 2014/0133119 A1 | 5/2014 | Kariya et al. |
| 2014/0141217 A1 | 5/2014 | Gulati et al. |
| 2014/0147623 A1 | 5/2014 | Shorey et al. |
| 2014/0147624 A1 | 5/2014 | Streltsov et al. |
| 2014/0165652 A1 | 6/2014 | Saito |
| 2014/0174131 A1 | 6/2014 | Saito et al. |
| 2014/0199519 A1 | 7/2014 | Schillinger et al. |
| 2014/0216108 A1 | 8/2014 | Weigel et al. |
| 2014/0239034 A1 | 8/2014 | Cleary et al. |
| 2014/0290310 A1 | 10/2014 | Green |
| 2014/0320947 A1 | 10/2014 | Egerton et al. |
| 2014/0333929 A1 | 11/2014 | Sung et al. |
| 2014/0352400 A1 | 12/2014 | Barrilado et al. |
| 2014/0361463 A1 | 12/2014 | DeSimone et al. |
| 2015/0034612 A1 | 2/2015 | Hosseini et al. |
| 2015/0038313 A1* | 2/2015 | Hosseini ............ B23K 26/0057 501/32 |
| 2015/0044445 A1 | 2/2015 | Garner et al. |
| 2015/0075221 A1 | 3/2015 | Kawaguchi et al. |
| 2015/0075222 A1 | 3/2015 | Mader |
| 2015/0110442 A1 | 4/2015 | Zimmel et al. |
| 2015/0118522 A1 | 4/2015 | Hosseini |
| 2015/0136743 A1* | 5/2015 | Hosseini ............ C03B 33/0222 219/121.61 |
| 2015/0140241 A1 | 5/2015 | Hosseini |
| 2015/0140735 A1* | 5/2015 | Hosseini ............ B81C 1/00634 438/107 |
| 2015/0151380 A1 | 6/2015 | Hosseini |
| 2015/0158120 A1* | 6/2015 | Courvoisier ....... B23K 26/0613 264/482 |
| 2015/0165548 A1 | 6/2015 | Marjanovic et al. |
| 2015/0165560 A1 | 6/2015 | Hackert et al. |
| 2015/0165562 A1 | 6/2015 | Marjanovic et al. |
| 2015/0165563 A1 | 6/2015 | Manley et al. |
| 2015/0166391 A1 | 6/2015 | Marjanovic et al. |
| 2015/0166393 A1 | 6/2015 | Marjanovic et al. |
| 2015/0166394 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0166397 A1 | 6/2015 | Marjanovic et al. |
| 2015/0183679 A1 | 7/2015 | Saito |
| 2015/0232369 A1 | 8/2015 | Marjanovic et al. |
| 2015/0299018 A1 | 10/2015 | Bhuyan et al. |
| 2015/0360991 A1 | 12/2015 | Grundmueller et al. |
| 2015/0367442 A1 | 12/2015 | Bovatsek et al. |
| 2016/0008927 A1 | 1/2016 | Grundmueller et al. |
| 2016/0009066 A1 | 1/2016 | Nieber et al. |
| 2016/0009585 A1 | 1/2016 | Bookbinder et al. |
| 2016/0016257 A1 | 1/2016 | Hosseini |
| 2016/0023922 A1 | 1/2016 | Addiego et al. |
| 2016/0031745 A1 | 2/2016 | Ortner et al. |
| 2016/0039044 A1 | 2/2016 | Kawaguchi |
| 2016/0060156 A1 | 3/2016 | Krueger et al. |
| 2016/0154284 A1 | 6/2016 | Sano |
| 2016/0159679 A1 | 6/2016 | West |
| 2016/0168396 A1 | 6/2016 | Letocart et al. |
| 2016/0280580 A1 | 9/2016 | Bohme |
| 2016/0290791 A1 | 10/2016 | Buono et al. |
| 2017/0052381 A1 | 2/2017 | Huang et al. |
| 2017/0169847 A1 | 6/2017 | Tamaki |
| 2017/0368638 A1 | 12/2017 | Tayebati et al. |

FOREIGN PATENT DOCUMENTS

| | | |
|---|---|---|
| CN | 1283409 C | 11/2006 |
| CN | 1890074 A | 1/2007 |
| CN | 1920632 A | 2/2007 |
| CN | 101031383 A | 9/2007 |
| CN | 101043936 A | 9/2007 |
| CN | 101502914 A | 8/2009 |
| CN | 101595554 A | 12/2009 |
| CN | 201357287 Y | 12/2009 |
| CN | 101622722 A | 1/2010 |
| CN | 101637849 A | 2/2010 |
| CN | 201471092 U | 5/2010 |
| CN | 101980982 A | 2/2011 |
| CN | 102105256 A | 6/2011 |
| CN | 102248302 A | 11/2011 |
| CN | 102343631 A | 2/2012 |
| CN | 102642092 A | 8/2012 |
| CN | 102649199 A | 8/2012 |
| CN | 102672355 A | 9/2012 |
| CN | 102741012 A | 10/2012 |
| CN | 102898014 A | 1/2013 |
| CN | 102916081 A | 2/2013 |
| CN | 102923939 A | 2/2013 |
| CN | 103013374 A | 4/2013 |
| CN | 103143841 A | 6/2013 |
| CN | 203021443 U | 6/2013 |
| CN | 103273195 A | 9/2013 |
| CN | 103316990 A | 9/2013 |
| CN | 103329035 A | 9/2013 |
| CN | 103339559 A | 10/2013 |
| CN | 103359947 A | 10/2013 |
| CN | 103359948 A | 10/2013 |
| CN | 103531414 A | 1/2014 |
| CN | 103746027 A | 4/2014 |
| CN | 203509350 U | 4/2014 |
| CN | 103817434 A | 5/2014 |
| CN | 103831539 A | 6/2014 |
| CN | 104344202 A | 2/2015 |
| CN | 102672355 B | 5/2015 |
| CN | 105081564 A | 11/2015 |
| CN | 105164581 A | 12/2015 |
| CN | 105209218 A | 12/2015 |
| CN | 105517969 A | 4/2016 |
| DE | 1020448 B | 12/1957 |
| DE | 2231330 A1 | 1/1974 |
| DE | 102006035555 A1 | 1/2008 |
| DE | 102012010635 A1 | 11/2013 |
| DE | 102012110971 A1 | 5/2014 |
| DE | 102013223637 A1 | 5/2015 |
| DE | 102014213775 A1 | 1/2016 |
| DE | 102016102768 A1 | 8/2017 |
| EP | 270897 A1 | 2/1992 |
| EP | 0609978 A1 | 8/1994 |
| EP | 656241 B1 | 12/1998 |
| EP | 938946 A1 | 9/1999 |
| EP | 949541 A2 | 10/1999 |
| EP | 1159104 B1 | 8/2004 |
| EP | 1609559 A1 | 12/2005 |
| EP | 1043110 B1 | 8/2006 |
| EP | 2105239 A1 | 9/2009 |
| EP | 2133170 A1 | 12/2009 |
| EP | 2202545 A1 | 6/2010 |
| EP | 2574983 A1 | 4/2013 |
| EP | 2754524 B1 | 7/2014 |
| EP | 2781296 A1 | 9/2014 |
| EP | 2783784 A2 | 10/2014 |
| EP | 2859984 A2 | 4/2015 |
| FR | 2989294 A1 | 10/2013 |
| GB | 1242172 A | 8/1971 |
| GB | 2481190 B | 1/2015 |
| JP | 61-074794 A | 4/1986 |
| JP | 62-046930 A | 2/1987 |
| JP | 63-192561 A | 8/1988 |
| JP | 01-179770 A | 7/1989 |
| JP | 1179770 A | 7/1989 |
| JP | 06-082720 A | 3/1994 |
| JP | 06-318756 A | 11/1994 |
| JP | 6318756 A | 11/1994 |
| JP | 08-184581 A | 7/1996 |
| JP | 9106243 A | 4/1997 |
| JP | 11197498 A | 7/1999 |
| JP | 11269683 A | 10/1999 |
| JP | 11330597 A | 11/1999 |
| JP | 11-347861 A | 12/1999 |

(56) References Cited

FOREIGN PATENT DOCUMENTS

| | | |
|---|---|---|
| JP | 11347758 A | 12/1999 |
| JP | 2001-130921 A | 5/2001 |
| JP | 2001138083 A | 5/2001 |
| JP | 2002-045985 A | 2/2002 |
| JP | 2002-205181 A | 7/2002 |
| JP | 2002210730 A | 7/2002 |
| JP | 2002228818 A | 8/2002 |
| JP | 2002-321081 A | 11/2002 |
| JP | 2003025085 A | 1/2003 |
| JP | 2003-062756 A | 3/2003 |
| JP | 2003-088985 A | 3/2003 |
| JP | 2003114400 A | 4/2003 |
| JP | 2003154517 A | 5/2003 |
| JP | 2003181668 A | 7/2003 |
| JP | 2003238178 A | 8/2003 |
| JP | 2004-182530 A | 7/2004 |
| JP | 2004209675 A | 7/2004 |
| JP | 2005104819 A | 4/2005 |
| JP | 2005-144487 A | 6/2005 |
| JP | 2005205440 A | 8/2005 |
| JP | 2005-263623 A | 9/2005 |
| JP | 2005288503 A | 10/2005 |
| JP | 2006-108478 A | 4/2006 |
| JP | 3775250 B2 | 5/2006 |
| JP | 3775410 B2 | 5/2006 |
| JP | 2006130691 A | 5/2006 |
| JP | 2006-182009 A | 7/2006 |
| JP | 2006-240948 A | 9/2006 |
| JP | 2006248885 A | 9/2006 |
| JP | 2006-327711 A | 12/2006 |
| JP | 2007021548 A | 2/2007 |
| JP | 2007196277 A | 8/2007 |
| JP | 2007253203 A | 10/2007 |
| JP | 2008-132616 A | 6/2008 |
| JP | 2008-168327 A | 7/2008 |
| JP | 2009-056482 A | 3/2009 |
| JP | 2009-126779 A | 6/2009 |
| JP | 2009-178725 A | 8/2009 |
| JP | 2010-017990 A | 1/2010 |
| JP | 2010-042424 A | 2/2010 |
| JP | 2010-046761 A | 3/2010 |
| JP | 4592855 B2 | 12/2010 |
| JP | 2011049398 A | 3/2011 |
| JP | 2011-512259 A | 4/2011 |
| JP | 4672689 B2 | 4/2011 |
| JP | 2011517299 A | 6/2011 |
| JP | 2011-520748 | 7/2011 |
| JP | 2011-147943 A | 8/2011 |
| JP | 2011-240291 A | 12/2011 |
| JP | 4880820 B2 | 2/2012 |
| JP | 2012024782 A | 2/2012 |
| JP | 2012031018 A | 2/2012 |
| JP | 2012159749 A | 8/2012 |
| JP | 2012-521889 | 9/2012 |
| JP | 2012187618 A | 10/2012 |
| JP | 2012-232894 A | 11/2012 |
| JP | 2012-528772 A | 11/2012 |
| JP | 2013007842 A | 1/2013 |
| JP | 2013031879 A | 2/2013 |
| JP | 2013043808 A | 3/2013 |
| JP | 2013-063863 A | 4/2013 |
| JP | 2013075802 A | 4/2013 |
| JP | 2013091578 A | 5/2013 |
| JP | 5274085 B2 | 8/2013 |
| JP | 5300544 B2 | 9/2013 |
| JP | 2013187247 A | 9/2013 |
| JP | 2013203630 A | 10/2013 |
| JP | 2013203631 A | 10/2013 |
| JP | 2013223886 A | 10/2013 |
| JP | 2015-091606 A | 5/2015 |
| JP | 2016-021077 A | 2/2016 |
| JP | 2016-513024 A | 5/2016 |
| JP | 2016-515085 A | 5/2016 |
| KR | 2012015366 | 2/2002 |
| KR | 2009057161 | 6/2009 |
| KR | 1020621 | 3/2011 |
| KR | 1120471 B1 | 3/2012 |
| KR | 2012074508 | 7/2012 |
| KR | 2013031380 | 3/2013 |
| KR | 1269474 | 5/2013 |
| KR | 2013124646 | 11/2013 |
| KR | 1344368 | 12/2013 |
| KR | 2014022980 | 2/2014 |
| KR | 2014022981 | 2/2014 |
| KR | 2014064220 | 5/2014 |
| KR | 10-2015-0009153 A | 1/2015 |
| TW | I362370 B | 4/2012 |
| TW | 201226345 | 7/2012 |
| TW | 201436968 A | 10/2014 |
| TW | I468354 B | 1/2015 |
| WO | 1999029243 A1 | 7/1999 |
| WO | 1999063900 A1 | 12/1999 |
| WO | 02/39063 A1 | 5/2002 |
| WO | 2003/007370 A1 | 1/2003 |
| WO | 2004110693 A1 | 12/2004 |
| WO | 2006073098 A1 | 7/2006 |
| WO | 2007094160 A1 | 8/2007 |
| WO | 2008080182 A1 | 7/2008 |
| WO | 2008128612 A1 | 10/2008 |
| WO | 2009/012913 A1 | 1/2009 |
| WO | 2009/114372 A2 | 9/2009 |
| WO | 2009114375 A2 | 9/2009 |
| WO | 2009/119694 A1 | 10/2009 |
| WO | 2010035736 A1 | 4/2010 |
| WO | 2010111609 A2 | 9/2010 |
| WO | 2010129459 A2 | 11/2010 |
| WO | 2011025908 A1 | 3/2011 |
| WO | 2011056781 A1 | 5/2011 |
| WO | 2012006736 A2 | 1/2012 |
| WO | 2012075072 A2 | 6/2012 |
| WO | 2012108052 A1 | 8/2012 |
| WO | 2012166753 A1 | 12/2012 |
| WO | 2013022148 A1 | 2/2013 |
| WO | 2013043173 A1 | 3/2013 |
| WO | 2013138802 A1 | 9/2013 |
| WO | 2013150990 A1 | 10/2013 |
| WO | 2013153195 A1 | 10/2013 |
| WO | 2014/012125 A1 | 1/2014 |
| WO | 2014028022 A1 | 2/2014 |
| WO | 2014064492 A1 | 5/2014 |
| WO | 2014079478 A1 | 5/2014 |
| WO | 2014079570 A1 | 5/2014 |
| WO | 2014085663 A1 | 6/2014 |
| WO | 2014111385 A1 | 7/2014 |
| WO | 2014111794 A1 | 7/2014 |
| WO | 2014161534 A2 | 10/2014 |
| WO | 2014161535 A2 | 10/2014 |
| WO | 2015077113 A1 | 5/2015 |
| WO | 2015/095014 A1 | 6/2015 |
| WO | 2015095088 A1 | 6/2015 |
| WO | 2015095090 A1 | 6/2015 |
| WO | 2015095146 A1 | 6/2015 |
| WO | 2015/114032 A1 | 8/2015 |
| WO | 2015/128833 A1 | 9/2015 |
| WO | 2015/132008 A1 | 9/2015 |
| WO | 2015127583 A1 | 9/2015 |
| WO | 2016/007843 A1 | 1/2016 |
| WO | 2016/010991 A1 | 1/2016 |
| WO | 2016005455 A1 | 1/2016 |
| WO | 2016010954 A2 | 1/2016 |
| WO | 2016154284 A1 | 9/2016 |
| WO | 2017/009149 A1 | 1/2017 |
| WO | 2017/079570 A2 | 5/2017 |
| WO | 2017/091529 A1 | 6/2017 |
| WO | 2017/093393 A1 | 6/2017 |

OTHER PUBLICATIONS

U.S. Appl. No. 62/208,282, filed Aug. 21, 2015.

Abakians, H. et al.; Evaporative Cutting of a Semitransparent Body With a Moving CW Laser; Journal of Heat Transfer; Nov. 1988; pp. 924-930; vol. 110; ASME.

(56) References Cited

OTHER PUBLICATIONS

Ahmed, F. et al.; Display glass cutting by femtosecond laser induced single shot periodic void array; Applied Physics A Material Science & Processing; Jun. 3, 2008; pp. 189-192; vol. 93; Springer-Verlag.

Bagchi, S. et al.; Fast ion beams from intense, femtosecond laser irradiated nanostructured surfaces; Applied Physics B Lasers and Optics; Jun. 27, 2007; pp. 167-173; vol. 88; Springer-Verlag.

Bhuyan, M.K. et al.; Femtosecond non-diffracting Bessel beams and controlled nanoscale ablation; ResearchGate Conference Paper; Sep. 2011; pp. 1-4.

Bhuyan, M.K. et al.; Laser micro- and nanostructuring using femtosecond Bessel beams; The European Physical Journal Special Topics; Dec. 7, 2011; pp. 101-110; vol. 1999; EDP Sciences, Springer-Verlag.

Bhuyan, M.K. et al.; Single-shot high aspect ratio bulk nanostructuring of fused silica using chirp-controlled ultrafast laser Bessel beams; Applied Physics Letters; Jan. 14, 2014; pp. 021107-1-021107-4; vol. 104; AIP Publishing LLC.

Bhuyan, M.K.; Ultrafast Bessel beams for high aspect ratio taper free micromachining of glass; Nonlinear Optics and Applications IV; 2010; pp. 77281V-1-77281V-8; vol. 7728; SPIE.

Case Design Guidelines for Apple Devices; Sep. 13, 2013; pp. 1-58; Apple Inc.

Chiao, R. Y. et al.; Self-Trapping of Optical Beams; Physical Review Letters; Oct. 12, 1964; pp. 479-482; vol. 13, No. 15.

Corning Eagle AMLCD Glass Substrates Material Information; Apr. 2005; pp. MIE 201-1-MIE 201-3; Corning Incorporated.

Corning 1737 AMLCD Glass Substrates Material Information; Aug. 2002; pp. MIE 101-1-MIE 101-3; Corning Incorporated.

Couairon, A. et al.; Femtosecond filamentation in transparent media; ScienceDirect Physical Reports; Feb. 6, 2007; pp. 47-189; vol. 441; Elsevier B.V.

Courvoisier, F. et al.; Applications of femtosecond Bessel beams to laser ablation; Applied Physics A Materials Science & Processing; Sep. 6, 2012; pp. 29-34; vol. 112; Springer-Verlag.

Courvoisier, F. et al.; Surface nanoprocessing with nondiffracting femtosecond Bessel beams; Optics Letters; Oct. 15, 2009; pp. 3163-3165; vol. 34, No. 20; Optical Society of America.

Dong, M. et al.; On-axis irradiance distribution of axicons illuminated by spherical wave; ScienceDirect Optics & Laser Technology; Sep. 2007; pp. 1258-1261; vol. 39; Elsevier Ltd.

Duocastella, M. et al.; Bessel and annular beams for materials processing; Laser & Photonics Reviews; 2012; pp. 607-621; vol. 6, No. 5.

Durnin, J.; Exact solutions for nondiffracting beams. I. The scalar theory; J. Opt. Soc. Am. A; Apr. 1987; pp. 651-654; vol. 4, No. 4; Optical Society of America.

Eaton, S. et al.; Heat accumulation effects in femtosecond laser-written waveguides with variable repetition rate; Optics Express; Jun. 13, 2005; pp. 4708-4716; vol. 13, No. 12; Optical Society of America.

Gattass, R. et al.; Micromachining of bulk glass with bursts of femtosecond laser pulses at variable repetition rates; Optics Express; Jun. 12, 2006; pp. 5279-5284; vol. 14, No. 12; Optical Society of America.

Gori, F. et al.; Analytical derivation of the optimum triplicator; Optics Communications; Dec. 1, 1998; pp. 13-16; vol. 157; Elsevier B.V.

Honda, M. et al.; A Novel Polymer Film that Controls Light Transmission; Progress in Pacific Polymer Science 3; 1994; pp. 159-169; Springer-Verlag Berlin Heidelberg.

Hu, Z. et al.; 5-Axis Laser Cutting Interference Detection and Correction Based on STL Model; Chinese Journal of Lasers; Dec. 2009; pp. 3313-3317; vol. 36, No. 12.

Huang, Z. et al.; Laser etching of glass substrates by 1064 nm laser irradiation; Applied Physics A Materials Science & Processing; Jun. 6, 2008; pp. 159-163; vol. 93; Springer-Verlag.

Juodkazis, S. et al.; Laser-Induced Microexplosion Confined in the Bulk of a Sapphire Crystal: Evidence of Multimegabar Pressures; Physical Review Letters; Apr. 28, 2006; pp. 166101-1-166101-4; vol. 96; The American Physical Society.

Karlsson, S. et al.; The Technology of Chemical Glass Strengthening—A Review; Glass Technology—European Journal of Glass Science and Technology Part A; Apr. 2010; pp. 41-54; vol. 51, No. 2.

Levy, U. et al.; Design, fabrication, and characterization of circular Dammann gratings based on grayscale lithography; Optics Letters; Mar. 15, 2010; pp. 880-882; vol. 35, No. 6; Optical Society of America.

Liu, X. et al.; Laser Ablation and Micromachining with Ultrashort Laser Pulses; IEEE Journal of Quantum Electronics; Oct. 1997; p. 1706-1716; vol. 33, No. 10; IEEE.

Maeda, K. et al.; Optical performance of angle dependent light control glass; Optical Materials Technology for Energy Efficiency and Solar Energy Conversion X; 1991; pp. 138-148; vol. 1536; SPIE.

Mbise, G. et al.; Angular selective window coatings; theory and experiments; J. Phys. D: Appl. Phys.; 1997; pp. 2103-2122; vol. 30; IOP Publishing Ltd.

McGloin, D. et al.; Bessel beams: diffraction in a new light; Contemporary Physics; Jan.-Feb. 2005; pp. 15-28; vol. 46; Taylor & Francis Ltd.

Merola, F. et al.; Characterization of Bessel beams generated by polymeric microaxicons; Measurement Science and Technology; May 15, 2012; pp. 1-10; vol. 23; IOP Publishing Ltd.

Mirkhalaf, M. et al.; Overcoming the brittleness of glass through bio-inspiration and micro-architecture; Nature Communications; Jan. 28, 2014; pp. 1-9; Macmillan Publishers Limited.

Romero, L. et al.; Theory of optimal beam splitting by phase gratings. II. Square and hexagonal gratings; J. Opt. Soc. Am. A; Aug. 2007; pp. 2296-2312; vol. 24, No. 8; Optical Society of America.

Salleo, A. et al.; Machining of transparent materials using an IR and UV nanosecond pulsed laser; Applied Physics A Materials Science & Processing; Sep. 20, 2000; pp. 601-608; vol. 71; Springer-Verlag.

Serafetinides, A. et al.; Polymer Ablation by Ultra-Short Pulsed Lasers; Proceedings of SPIE; 2000; pp. 409-415.

Shah, L. et al.; Micromachining with a High Repetition Rate Femtosecond Fiber Laser; JLMN-Journal of Laser Micro/Nanoengineering; Nov. 2008; pp. 157-162; vol. 3, No. 3.

Shealy, D. et al.; Geometric optics-based design of laser beam shapers; Opt. Eng.; Nov. 2003; pp. 3123-3138; vol. 42, No. 11; Society of Photo-Optical Instrumentation Engineers.

Stoian, R. et al.; Spatial and temporal laser pulse design for material processing on ultrafast scales; Applied Physics A Materials Science & Processing; Jan. 1, 2014; pp. 119-127; vol. 114; Springer-Verlag Berlin Heidelberg.

Thiele, E.; Relation between Catalytic Activity and Size of Particle; Industrial and Engineering Chemistry; Jul. 1939 pp. 916-920; vol. 31, No. 7.

Toytman, I. et al.; Optical breakdown in transparent media with adjustable axial length and location; Optic Express; Nov. 22, 2010; pp. 24688-24698; vol. 18, No. 24; Optical Society of America.

Velpula, P. et al.; Ultrafast imaging of free carriers: controlled excitation with chirped ultrafast laser Bessel beams; Laser Applications in Microelectronic and Optoelectronic Manufacturing (LAMOM) XIX; Proc. Of SPIE; 2014; pp. 896711-1-896711-8; vol. 8967; SPIE.

Wang, Z. et al.; Investigation on CO2 laser irradiation inducing glass strip peeling for microchannel formation; Biomicrofluidics; Mar. 12, 2012; pp. 012820-1-012820-12; vol. 6; American Institute of Physics.

Ra & RMS: Calculating Surface Roughness; Harrison Eelectropolishing; 2012.

Wu, W. et al.; Optimal Orientation of the Cutting Head for Enhancing Smoothness Movement in Three-Dimensional Laser Cutting; Chinese Journal of Lasers; Jan. 2013; pp. 0103005-1-0103005-7, vol. 10, No. 1.

GT ASF Grown Sapphire Cover and Touch Screen Material; www.gtat.com; 2012; pp. 1-2; GTAT Corporation.

(56) References Cited

OTHER PUBLICATIONS

Xu, H. et al.; Optimization of 3D laser cutting head orientation based on minimum energy consumption; Int J Adv Manuf Technol; Jun. 28, 2014; pp. 1283-1291; vol. 74; Springer-Verlag London.

Yan, Y. et al.; Fiber structure to convert a Gaussian beam to higher-order optical orbital angular momentum modes; Optics Letters; Aug. 15, 2012; pp. 3294-3296; vol. 37, No. 16; Optical Society of America.

Abramov et al., "Laser separation of chemically strengthened glass"; Physics Procedia 5 (2010) 285-290, Elsevier,; doi: 10.1016/j.phpro.2010.08.054.

Arimoto et al., "Imaging properties of axicon in a scanning optical system"; Applied Optics, Nov. 1, 1992, vol. 31, No. 31, pp. 6653-6657.

"TruMicro 5000" Product Manual, Trumpf Laser GmbH + Co. KG, pp. 1-4, Aug. 2011.

Bhuyan et al., "High aspect ratio nanochannel machining using single shot femtosecond Bessel beams"; Applied Physics Letters 97, 081102 (2010); doi: 10.1063/1.3479419.

Bhuyan et al., "High aspect ratio taper-free microchannel fabrication using femtosecond Bessel beams"; Optics Express (2010) vol. 18, No. 2, pp. 566-574.

Cubeddu et al., "A compact time-resolved reflectance system for dual-wavelength multichannel assessment of tissue absorption and scattering"; Part of the SPIE Conference on Optical Tomography and Spectroscopy of Tissue III, San Jose, CA (Jan. 1999), SPIE vol. 3597, 0277-786X/99, pp. 450-455.

Cubeddu et al., "Compact tissue oximeter based on dual-wavelength multichannel time-resolved reflectance"; Applied Optics, vol. 38, No. 16, Jun. 1, 1999, pp. 3670-3680.

Ding et al., "High-resolution optical coherence tomography over a large depth range with an axicon lens"; Optic Letters, vol. 27, No. 4, pp. 243-245, Feb. 15, 2002, Optical Society of America.

"EagleEtch" Product Brochure, EuropeTec USA Inc., pp. 1-8, Aug. 1, 2014.

Girkin et al., "Macroscopic multiphoton biomedical imaging using semiconductor saturable Bragg reflector modelocked Lasers"; Part of the SPIE Conference on Commercial and Biomedical Applications of Ultrafast Lasers, San Jose, CA (Jan. 1999), SPIE vol. 3616, 0277-786X/99, pp. 92-98.

Glezer et al., "Ultrafast-laser driven micro-explosions in transparent materials"; Applied Physics Letters, vol. 71 (1997), pp. 882-884.

Golub, I., "Fresnel axicon"; Optic Letters, vol. 31, No. 12, Jun. 15, 2006, Optical Society of America, pp. 1890-1892.

Herman et al., "Laser micromachining of 'transparent' fused silica with 1-ps pulses and pulse trains"; Part of the SPIE Conference on Commercial and Biomedical Applications of Ultrafast Lasers, San Jose, CA (Jan. 1999), SPIE vol. 3616, 0277-786X/99, pp. 148-155.

Kosareva et al., "Formation of extended plasma channels in a condensed medium upon axicon focusing of a femtosecond laser pulse"; Quantum Electronics 35 (11) 1013-1014 (2005), Kvantovaya Elektronika and Turpion Ltd.; doi: 10.1070/QE2005v035n11ABEH013031.

Krüger et al., "Femtosecond-pulse visible laser processing of transparent materials"; Applied Surface Science 96-98 (1996) 430-438.

Krüger et al., "Laser micromachining of barium aluminium borosilicate glass with pluse durations between 20 fs and 3 ps"; Applied Surface Science 127-129 (1998) 892-898.

Krüger et al., "Structuring of dielectric and metallic materials with ultrashort laser pulses between 20 fs and 3 ps"; SPIE vol. 2991, 0277-786X/97, pp. 40-47.

Lapczyna et al., "Ultra high repetition rate (133 MHz) laser ablation of aluminum with 1.2-ps pulses"; Applied Physics A 69 [Suppl.], S883-S886, Springer-Verlag (1999); doi: 10 1007/S003399900300.

Perry et al., "Ultrashort-pulse laser machining"; UCRL-JC-132159 Rev 1., Jan. 22, 1999, pp. 1-24.

Perry et al., "Ultrashort-pulse laser machining"; UCRL-ID-132159, Sep. 1998, pp. 1-38.

Perry et al., "Ultrashort-pulse laser machining of dielectric materials"; Journal of Applied Physics, vol. 85, No. 9, May 1, 1999, American Institute of Physics, pp. 6803-6810.

"Pharos High-power femtosecond laser system" product brochure; Light Conversion, Vilnius, LT; Apr. 18, 2011, pp. 1-2.

Polynkin et al., "Extended filamentation with temporally chirped femtosecond Bessel-Gauss beams in air"; Optics Express, vol. 17, No. 2, Jan. 19, 2009, OSA, pp. 575-584.

Serafetinides et al., "Ultra-short pulsed laser ablation of polymers"; Applied Surface Science 180 (2001) 42-56.

Sundaram et al., "Inducing and probing non-thermal transitions in semiconductors using femtosecond laser pulses"; Nature Miracles, vol. 1, Dec. 2002, Nature Publishing Group (2002), pp. 217-224.

Vanagas et al., "Glass cutting by femtosecond pulsed irradiation"; J. Micro/Nanolith. MEMS MOEMS. 3(2), 358-363 (Apr. 1, 2004); doi: 10.1117/1.1668274.

Varel et al., "Micromachining of quartz with ultrashort laser pulses"; Applied Physics A 65, 367-373, Springer-Verlag (1997).

Yoshino et al., "Micromachining with a high repetition rate femtosecond fiber laser"; JLMN-Journal of Laser Micro/Nanoengineering vol. 3, No. 3 (2008), pp. 157-162.

Zeng et al. "Characteristic analysis of a refractive axicon system for optical trepanning"; Optical Engineering 45(9), 094302 (Sep. 2006), pp. 094302-1-094302-10.

Zhang et al., "Design of diffractive-phase axicon illuminated by a Gaussian-profile beam"; Acta Physica Sinica (overseas edition), vol. 5, No. 5 (May 1996) Chin. Phys. Soc., 1004-423X/96/05050354-11, pp. 354-364.

Betriebsanleitung TruMicro Series 5000, "Ausgabe May 2008 Betriebsanleitung TruMicro Series 5000_Anlage E2a-1.pdf".

Case study: Simulation einer Beschneidung des Femfelds eines Bessel-Gauß-Strahls GMvP6 p. 1.

Chinese Patent Application No. 201680040825.3, Office Action dated Mar. 31, 2021, 15 pages (English Translation Only), Chinese Patent Office.

Corning Inc., Corning Eagle2000TM AMLCD Glass Substrates Material Information, issued Apr. 2005. (Year: 2005).

Eaton et al. "Heat accumulation effects in femtosecond laser written waveguides with variable repetition rates", Opt. Exp. 5280, vol. 14, No. Jun. 23, 2006.

Faccio et al. "Kerr-induced spontaneous Bessel beam formation in the regime of strong two-photon absorption" Optics Express 16(11) 2008, pp. 8213-8218.

Flamm et al., "Higher-order Bessel-like Beams for Optimized Ultrafast Processing of Transparent Materials" GMvP 19.

Flamm et al., "Higher-order Bessel-like Beams for Optimized Ultrafast Processing of Transparent Materials" GMvP 20.

High aspect ratio machining . . . Anlage E8-1.pdf.

http://www.gtat.com/Collateral/Documents/Engltsh-US/Sapphire/12-21-12_GT_TnuchScreen_ V3_web.pdf.

Japanese Patent Application No. 2018-500609 Office Action dated Mar. 31, 2021, 6 pages (3 pages of English Translation and 3 pages of Original Document); Japanese Patent Office.

Jonas Weiss, et al., "Optical Interconnects for Disaggregated Resources in Future Datacenters", ECOC 2014, Cannes-France, 3 pgs.

Kerr. "Filamentary tracks formed in laser optical glass by laser beam self-focusing. II. Theoretical Analysis" Physical Review A., 4(3) 1971, pp. 1196-1218.

Liu,Xiuwen, "Graphical Audio-Visual Technology Tips", Apr. 30, 2006, pp. 58-59. (Original Document Only).

Louis A. Romero* and Fred M. Dickey, "Theory of optimal beam splitting by phase gratings. I. One-dimensional gratings" J. Opt. Soc. Am., A 24, 2280, (2007).

Merkmalsgliederung Patentanspruch 1 des Streitpatents, "Merkmalsgliederung Patentanspruch 1 _Anlage E15-1.pdl".

Merkmalsgliederung Patentanspruch 12 des Streitpatents,"Merkmalsgliederung Patentanspruch 12 _Anlage E16-1.pdf".

Norm: ISO/TR 11146-3 , Technical Report First edition GMvP Norm-TR 1 Pages.

Polesana (Polesana, P., Dubietis, A., Porras, A. Kucinskas, E. Faccio, D. Couairon, A. and DiTrapani, P.,, "Near-field dynamics of

(56) References Cited

OTHER PUBLICATIONS ultrashort pulsed Bessel beams in media with Kerr nonlinearity", Physical Review E 73, 056612 (2006)).

Product Data Sheet for Corning Eagle XG Slim Glass, Issued Aug. 2013; 2 Pages.

Product data sheet for Corning Eagle XR glass substrate, issued Jan. 2006 (Year: 2006).

Produktbeschreibung Pharos Laser vom Apr. 18, 2011, "Pharos_2011 Anlage E 1 a-1. pdf".

Sukumaran, "Design, Fabrication, and Characterization of Ultrathin 3-D Glass Interposers with Through-Package-Vias at Same Pitch as TSVs in Silicon." IEEE Transactions on Components, Packaging and Manufacturing Technology, vol. 4, No. 5: 786-795, (2014.).

Sukumaran, "Through-Package-Via Formation and Metallization of Glass Interposers.", Electronic Components and Technology Conference: 557-563, (2010).

Tian e al., "Development status and Prospects of TFT-LCD Substrate Glass Chemical Composition", vol. 29, No. 6, 2010, pp. 1348-1362 (English Abstract Submitted).

Tsai et al., "Internal modification for cutting transparent glass using femtosecond Bessel beams", Optical Engineering, Soc. of Photo-optical Instrumentation Engineering, Bellingham, vol. 53, May 2014, p. 51503.

Tymon Barwicz, et al., "Assembly of Mechanically Compliant Interfaces between Optical Fibers and Nanophotonic Chips", Tymon Barwicz (IBM), et al., Electronic Components & Technology Conference, 2014,. 978-4799-2407-3, 2014 IEEE, pp. 179-185.

Unichains, Engineering Manual: Innovative Belt & Chain solutions for every industry and application, available publically at least as of Jun. 1, 2016 as evidenced at the following hyperlink: https://web.archive.Org/web/20160601000000/http://www.unichains.com/.

What is the difference between Ra and RMS?; Harrison Electropolishing LP; (http://www.harrisonep.com/electropolishingra.html), Accessed Aug. 8, 2016.

* cited by examiner

METHODS OF CONTINUOUS FABRICATION OF HOLES IN FLEXIBLE SUBSTRATE SHEETS AND PRODUCTS RELATING TO THE SAME

CROSS-REFERENCE TO RELATED APPLICATIONS

This application claims the benefit of priority under 35 U.S.C. §119 of U.S. Provisional Application Serial No. 62/190823 filed on Jul. 10, 2015 the content of which is relied upon and incorporated herein by reference in its entirety.

BACKGROUND

Glass has many advantages over traditional crystalline silicon and organic substrates for use as electrical interposer substrates in semiconductor applications. One advantage of glass is that it may be fabricated in a large flat panel format—i.e., in sizes well in excess of traditional 300 mm wafer sizes, even up to many meters on a side. Another is the mechanical rigidity of glass. Yet another advantage of glass is its high electrical impedance. This is especially helpful at higher frequencies, in particular for the radio frequencies (RF) employed for high data transmission rates. In addition, specialty glass substrates can be formed, such as via a fusion forming process, with very flat and smooth surfaces, reducing or eliminating any need for costly polishing steps. This low roughness, or surface quality, of the glass sheets allows them to be patterned with dense (closed spaced) electrical traces.

Currently, the semiconductor market is dominated by crystalline silicon, and the semiconductor chips themselves are most frequently fabricated out of silicon. As such, a large amount of silicon wafer infrastructure is in place, and glass that can be handled and behaves like silicon may be used in the infrastructure already in place. Fortunately, glass can be cut into wafer shapes when desired. Also, glass compositions can be tailored to have similar coefficients of thermal expansions to that of silicon (e.g., approximately 3 ppm/C).

One use of such resulting glass wafers is simply as carrier substrates on which thin silicon wafers are affixed and processed. Other uses include the use of glass wafers to form substrates for RF components or for electrical interposers. Interposers, for example, provide an interconnecting board that routes electrical signals between two electrical processing chips, such as between a CPU (central processing unit) and another CPU, or between a CPU and a GPU (graphical processing unit), or between a CPU and other devices underneath. In order for glass wafers to be used in this way, the wafer needs to have many (e.g., approximately hundreds of thousands or more) holes in it at application specific locations. To make the electrical connections, metal traces are patterned on the glass surfaces and the interior of the holes are metallized in an equally precise manner using lithography and metal vapor deposition or electroplating.

Once metalized, the glass can be incorporated into a circuit board and chips are bonded to it. Later, the wafer is diced to separate out the individual components.

Traditional glass interposers are formed from wafers that have already been cut to the desired size and shape. These wafers are loaded into a laser system. These laser systems may use mechanical fixtures or vision alignment to align to edges of the wafers or other fiducials on the wafers. The laser process then creates the desired hole pattern within the wafers. The wafers are then unloaded. This is a one-at-a-time type operation. This process flow leads to a number of manufacturing inefficiencies.

Inventory management can be problematic. There are numerous wafer sizes and shapes (100,150, 200, 300 mm diameters, with notches, flats, etc., panels of various dimensions, each of different compositions or thicknesses) desired by end users, and all of these must be made ahead of time and kept in sufficient quantities in inventory.

Pattern accuracy, e.g., the precision of hole placement relative to the edges of the wafers, is also less than optimal. Since the wafers are generally cut with a mechanical score and break process and then undergo an edge grind process, the accuracy to which the geometry and sizes of the wafers are made is generally ±100 microns or greater. This in turn leads to variability in where the hole pattern is placed relative to the geometric edges of the wafer. This uncertainty cascades into increased alignment complexity needed in order to locate hole patterns in downstream processes such as lithographic steps for metal trace patterning.

The cost of cutting and finishing the wafers can also be significant. While mechanical score and break equipment is relatively inexpensive, the time and cost of grinding the edges of the wafers to the exact shape desired can be large (e.g., many tens of dollars/wafer) because of the amount of material removal needed and also because the facilities with such cut and grind capabilities are not always co-located with the interposer drilling process equipment. In addition, a primary purpose of the mechanical edge grinding is to remove damage from the mechanical cutting process, improving the reliability or strength of the wafers edges so that the wafers can survive shipment and downstream process handling. However, the wafer edges do not serve a function in the final interposer/chip application, as the interposer dies are cut out of the wafers and hence any finished edges are thrown away. Thus, the true requirement for wafer edges is merely to have sufficient strength and reliability to be handled.

There exists a need for laser processing substrate sheets, such as glass substrate sheets, for use in applications where a glass sheet with vias is needed, for example in RF and interposer products.

SUMMARY

Systems and processes of cutting and drilling in a target substrate uses a laser (e.g., a pulsed laser) and an optical system to generate a line focus of the laser beam within the target substrate, such as a glass substrate sheet, are provided. The pulsed laser cutting and drilling system and process creates holes or defects that, in certain embodiments, extend the full depth of the glass sheet with each individual laser burst pulse, and allows the laser system to cut and separate the target substrate into any desired contour by creating a series of perforations that form a contour or desired part shape. Since a glass substrate sheet is brittle, cracking will then follow the perforated contour, allowing the glass substrate sheet to separate into any required shape defined by the perforations.

In a first aspect, a process of fabricating a substrate is provided. The process includes disposing a substrate sheet at a laser processing assembly. The laser processing assembly includes at least one laser operable to emit a laser beam. The substrate sheet is substantially transparent to the laser beam. The process further includes focusing the laser beam into a laser beam focal line, viewed along a beam propagation direction of the laser beam. The laser beam focal line is directed into the substrate and generates an induced absorption within the substrate. The induced absorption produces a defect along the laser beam focal line within the substrate sheet. The substrate is translated relative to the laser beam to laser drill a plurality of internal defects within the substrate. A first plurality of defects and a second plurality of defects are created. The second plurality of defects defines a closed boundary, and the first plurality of defects is disposed within the closed boundary. At least one component piece of the substrate is separated along the closed boundary defined by the second plurality of defects.

In a second aspect according to the first aspect, the substrate is selected from the group consisting of a glass substrate sheet, a glass-ceramic substrate sheet, fused silica, and a sapphire sheet.

In a third aspect according to any of the previous aspects, the second plurality of defects have a pitch of less than about 20 um between defects.

In a fourth aspect according to any of the previous aspects, the first plurality of defects are less than about 10 um in diameter and extend greater than about 100 um in depth.

In a fifth aspect according to any of the previous aspects, further comprising etching the first plurality of defects to enlarge the first plurality of defects In a sixth aspect according to any of the previous aspects, the first plurality of defects comprises holes having a diameter between about 10 um and 120 um and extending through the substrate.

In a seventh aspect according to the sixth aspect, further comprising metallizing the first plurality of defect holes extending through the substrate.

In an eighth aspect according to any of the previous aspects, the operation of separating the component piece along the boundary defined by the second plurality of external defects provides a serrated edge along at least one side of the component piece.

In a ninth aspect according to the eighth aspect, the serrated edge is formed by the second plurality of defects of the closed boundary, wherein an amplitude of the serration is less than about 10 um and a pitch of the serrations is less than about 20 um.

In a tenth aspect according to any of the previous aspects, the operation of separating the component piece along the boundary defined by the plurality of external defects is performed using an infrared laser.

In an eleventh aspect according to any of the previous aspects, the operation of creating the first plurality of defects is performed prior to the operation of creating the second plurality of defects.

In a twelfth aspect according to any of the previous aspects, the operation of creating the second plurality of defects is performed prior to the operation of creating the first plurality of defects.

In a thirteenth aspect according to any of the previous aspects, a first optical head is adapted to provide the first plurality of defects and a second optical head is adapted to provide the second plurality of defects.

In a fourteenth aspect according to any of the previous aspects, the operation of providing the substrate disposed at a laser processing assembly comprises providing the substrate disposed about a roll.

In a fifteenth aspect according to any of the previous aspects, the laser beam comprises a pulsed laser beam.

In a sixteenth aspect according to any of the previous aspects, the substrate has an absorption or scattering of a wavelength of the laser beam of less than about 10%.

In a seventeenth aspect according to any of the previous aspects, further comprising metallizing the first plurality of defects to provide for electrical conductivity through the first plurality of defects.

In an eighteenth aspect according to any of the previous aspects, the laser beam has an average laser burst pulse energy measured at the material greater than about 40 µJ, pulses having a duration in a range of between greater than about 1 picosecond and less than about 100 picoseconds, and a repetition rate in a range of between about 100 Hz and about 1 MHz.

In a nineteenth aspect according to any of the previous aspects, a plurality of component pieces are defined by a plurality of sets of the second plurality of defects that each define a closed boundary and a plurality of the first plurality of defects are disposed within each closed boundary.

In a twentieth aspect, an article is provided. The article includes a substrate having a first side and an opposing second side. The substrate has an absorption or scattering of a wavelength of a laser beam of less than about 20%. A first plurality of defects is formed internal to a boundary of the substrate that extend into the substrate. A boundary edge is formed by a second plurality of defects and a plurality of micro cracks extending between the second plurality of defects. The second plurality of defects is spaced from each other at a pitch less than about 20 µm. The second plurality of defects each have a width of less than about 10 um and extend through at least about 50% of a thickness of the substrate.

In a twenty-first aspect according to the twentieth aspect, each of the second plurality of defects extend through the entire thickness of the glass substrate layer.

In a twenty-second aspect according to the twentieth or twenty-first aspect, the substrate comprises greater than 1,000 first plurality of defects formed within a boundary defined by the second plurality of defects and the first plurality of defects each have a diameter of less than about 3 um.

In a twenty-third aspect according to any one of the twentieth through twenty-second aspects, the substrate comprises greater than 1,000 first plurality of defects formed within a boundary defined by the second plurality of defects and the first plurality of defects each have a diameter of greater than about 5 um and less than about 120 um.

In a twenty-fourth aspect according to any one of the twentieth through twenty-third aspects, the first plurality of defects comprise a plurality of blind holes.

In a twenty-fifth aspect according to any one of the twentieth through twenty-fourth aspects, an electrically conductive path is formed by a metallization layer extending through the first plurality of holes.

In a twenty-sixth aspect according to any one of the twentieth through twenty-fifth aspects, a plurality of component pieces are defined from the substrate by a plurality of sets of the second plurality of defects that each define a closed boundary and a plurality of the first plurality of defects are disposed within each closed boundary.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the representative embodiments.

DETAILED DESCRIPTION

Figure 1:
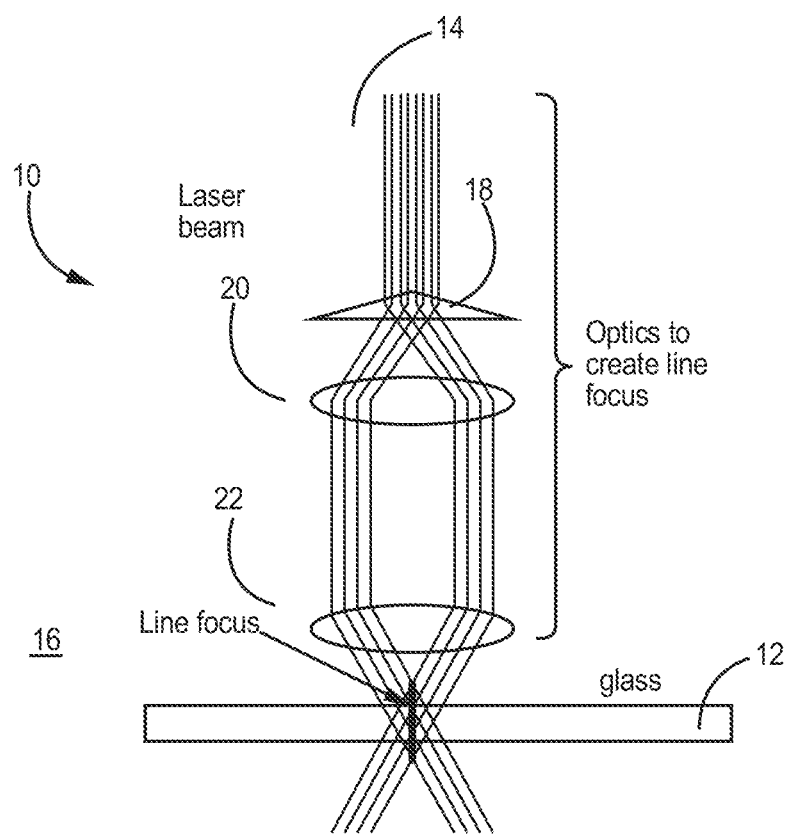
FIG. 1 is a schematic illustration of an example optical system adapted to process a substrate using a laser beam according to one or more embodiments described and illustrated herein.

The embodiments disclosed herein relate to methods for drilling and cutting glass materials. In one embodiment, for example, a first plurality of defects and a second plurality of defects are created. In this embodiment, the second plurality of defects defines a closed boundary, and the first plurality of defects is disposed within the closed boundary. At least one component piece of the substrate is separated along the closed boundary defined by the second plurality of defects.

In various implementations, a system and process of cutting and drilling in a target substrate uses a pulsed laser and an optical system to generate a line focus of the laser beam within the target substrate, such as a glass substrate sheet. The pulsed laser cutting and drilling system and process creates holes or defects that, in certain embodiments, extend the full depth of the glass sheet with each individual laser pulse, and allows the laser system to cut and separate the target substrate into any desired contour by creating a series of perforations that form a contour or desired part shape. Since a glass substrate sheet is brittle, cracking will then follow the perforated contour, allowing the glass substrate sheet to separate into any required shape defined by the perforations. The system and process can cut a multitude of glass compositions, ranging from high stress glasses (e.g. ion-exchanged) to low stress glasses (e.g. Corning Eagle XG) at high speeds (>500 mm/s), allowing cutting complex shapes with tight radii and complex contours. In addition, the system and process can further be adapted to make desired pilot hole patterns in glass wafers. An acid etch process may also be used to enlarge the holes. The resulting article can then be used for applications where a glass substrate with vias could be used, including, but not limited to, interposers, substrates for RF components, or substrates for fingerprint sensors.

In some embodiments, the systems and processes described herein solve the above mentioned problems by combining both the cutting of the glass part with the creation of the desired internal hole pattern in one line focus pulsed laser platform. In these particular embodiments, the same laser beam delivery system that creates a first set of defects, such as pilot hole patterns can also be used to create a second set of defects adapted to perforate and separate (i.e. cut) the larger substrates (e.g., glass sheet substrates) into wafers, panels, or sub-panels. A user loads a glass panel of appropriate thickness and glass composition into the system, and the output is fully cut parts (e.g. wafers or sub-panels) with pilot hole patterns (first set of defects) that can be etched in a subsequent process step. This may be done with a single optical head, or alternatively, another possibility is to employ two different optical heads within the same machine/process—one for creating the desired first set of defects (e.g., pilot hole pattern) and a second that creates a second set of defects oriented to outline and used to cut the desired wafer shapes. This saves significant cost by reducing manufacturing process steps (grinding/finishing), simplifying inventory management, and increasing manufacturing agility to making different products. In addition it enhances product performance by improving dimensional accuracy of the resulting parts.

It should also be noted that while the word wafer is used, often end users request non-wafer shapes. These can be panels or sub-panels and have their own specific geometry. Where the word wafer is used, it is to be understood that panel or subpanel would be equally valid.

In other embodiments, a substrate may be cut into individual components along a boundary or perimeter formed by the second set of defects and then a first set of defects (e.g., pilot holes) may be drilled or otherwise formed in the individual components in a separate step after the substrate has been cut into various component pieces along the boundary or perimeter formed by the second set of defects. In this embodiment, drilling the first set of defects may be performed via a focus line laser process or any other acceptable drilling process. Similarly, other processes of cutting a substrate into individual components along a boundary or perimeter formed by the second set of defects and a focus line laser process may be used to drill or otherwise process the individual components to create a first set of defects (e.g., pilot holes, vias or interposers) after they have been cut into pieces.

The line focus and short pulse laser process described herein is unique in that it allows for both cutting and drilling of substrates, such as glass substrates, with high speed (hundreds of mm/sec to greater than 1 m/sec cutting, hundreds or thousands of holes/sec drilling or greater), and/or with suitable quality (edge strength greater than 100 MPa, low sub-surface damage of less than 100 microns, holes with diameter as small as 5 microns, holes with no surface chips and/or parts that retains strength of greater than 90% as compared to undrilled glass substrates).

These laser generated defects allow for cutting substrates (e.g., glass sheet substrates) around a boundary or perimeter of a part using defects/perforations and fabricating holes on an interior of a part by etching out the defects/perforations to make holes. Embodiments described herein detail how the cutting and drilling processes may be employed in a single laser system to make glass interposer parts very efficiently and accurately, or, even if done by multiple systems, used to make glass interposer parts more cost effectively than with other methods.

Typical laser machining processes use a Gaussian, or approximately Gaussian, laser beams focused to a spot (or point). When focused to a very small region (typically microns in diameter) of sufficient intensity to vaporize or ablate glass, such a beam will diffract or spread out very quickly, typically within tens of microns. This means that only a very small portion of the glass can be modified by each laser pulse.

In contrast, the focus line laser and short pulse laser processes described herein employ optics that create an extended focus, or line focus. An example of an optical system 10 adapted for creating such a line focus is illustrated in FIG. 1.

Referring now to FIG. 1, an example optical system 10 adapted to process a substrate 12, such as a glass substrate, using a laser beam 14 is schematically illustrated. In the system 10, for example, the optical system 10 is adapted to produce a line focus 16 for the laser beam 14 on the substrate 12. The line focus 16 of the laser beam 14 can be adapted to fabricate defects or perforations (e.g., the second set of defects described above) oriented to allow for cutting the substrate 12 along a boundary or perimeter of the defects or perforations and/or for fabricating a first set of defects to provide holes within the substrate 12 disposed within the boundary or perimeter of the second set of defects or perforations.

The optical system 10 is adapted to focus the laser beam 14 (e.g., a pulsed laser beam) into a laser beam focal line 16 oriented along the beam propagation direction. The substrate 12 (e.g., a glass substrate sheet) is substantially transparent to the laser wavelength when the absorption is less than about 10%, in some examples less than about 1% per mm of material depth at this wavelength. As shown in FIG. 1, a laser emits laser beam 14, which has a portion incident to the optical assembly 10. The optical assembly 10 turns the incident laser beam into an extensive laser beam focal line 16 on an output side of the optical system 10 over a defined expansion range along the beam direction. The planar substrate 12 (e.g., the glass substrate sheet) is positioned in the beam path to at least partially overlap the laser beam focal line 16 of laser beam 14. The laser beam focal line 16 is thus directed into the substrate 12.

In one embodiment, for example, an incident Gaussian beam from a laser is passed through an axicon 18 (a conical optical element), which creates a line focus. The line focus can be propagated or re-imaged through other standard optical elements such as lenses that form a telescope in order to project it to another location and also alter its spatial extent. This is sometimes referred to as creating a Bessel beam, or more specifically a Gauss-Bessel beam. Such a beam diffracts much more slowly than a Gaussian beam, allowing a central region (approximately a few microns in diameter) of very high optical intensity to be maintained over very long ranges (approximately millimeters). Other solutions also are possible that form an extended line focus, which in a broader context is often referred to as non-diffracting beams.

In the particular embodiment shown in FIG. 1, for example, an axicon 18 disperses at least a portion of the laser beam 14 incident to the optical assembly 10 toward a first lens 20. The first lens 20 collimates the dispersed laser beam 14 within the optical assembly 10 toward a second lens 22. The second lens 22 receives the collimated portion of the laser beam 14 and focuses the beam 14 toward the substrate 12 to focus the beam into a laser beam focal line 16.

In one embodiment, the line focus is used in conjunction with very high pulse energy short pulsed laser (e.g., less than 10 ps pulse width, approximately 50 to 500 uJ/burst). Many short pulse lasers allow a mode of operation called "burst" pulse mode. A "burst" pulse is a sequence of pulses that are closely spaced in time (e.g. 20 nsec), whereas the time between each "burst" may be longer, such as 10 usec. Since the gain medium for such lasers has a fixed amount of energy that can be extracted on a short time scale, typically the total energy within a burst is conserved, i.e. if the laser is operated at a constant frequency then the total energy within a two pulse burst will be the same as the total energy within a six pulse burst. Each pulse is focused to a line and, through the process of non-linear absorption, creates a line defect within the glass. In this embodiment, the substrate is substantially transparent to the radiation (typically <10% absorption per mm), otherwise the energy will be absorbed at or near the surface of the glass and not reach the interior to form a line. However, in other embodiments, where a complete through hole is not required a less transparent substrate may also be used. In one embodiment, the wavelength of the laser is approximately 1064 nm, which can be produced by a Nd:YVO$_4$ laser or similar (e.g. YAG) gain material. In addition, various harmonics of this wavelength may also be used, such as approximately 532 nm (doubled frequency), or approximately 355 nm (tripled frequency). These harmonics are easily available by employing non-linear conversion crystal(s) at the output of the laser head.

The result in the transparent substrate is very similar to the effect of perforating paper. The perforations remove very little material, but are capable of guiding a tear or crack that ultimately separates the substrate. If these defects are spaced close together, cracks form to interconnect the defects. One advantage of this process is that very little material is removed, and therefore, very little debris is generated.

Figure 4:
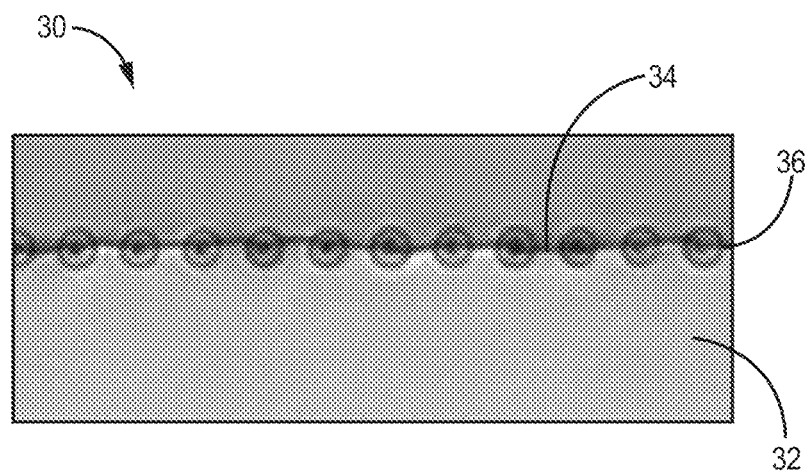
FIG. 4 an example microscope image of a substrate showing a crack connecting laser formed defects or perforations according to one or more embodiments described and illustrated herein.
Figure 5:
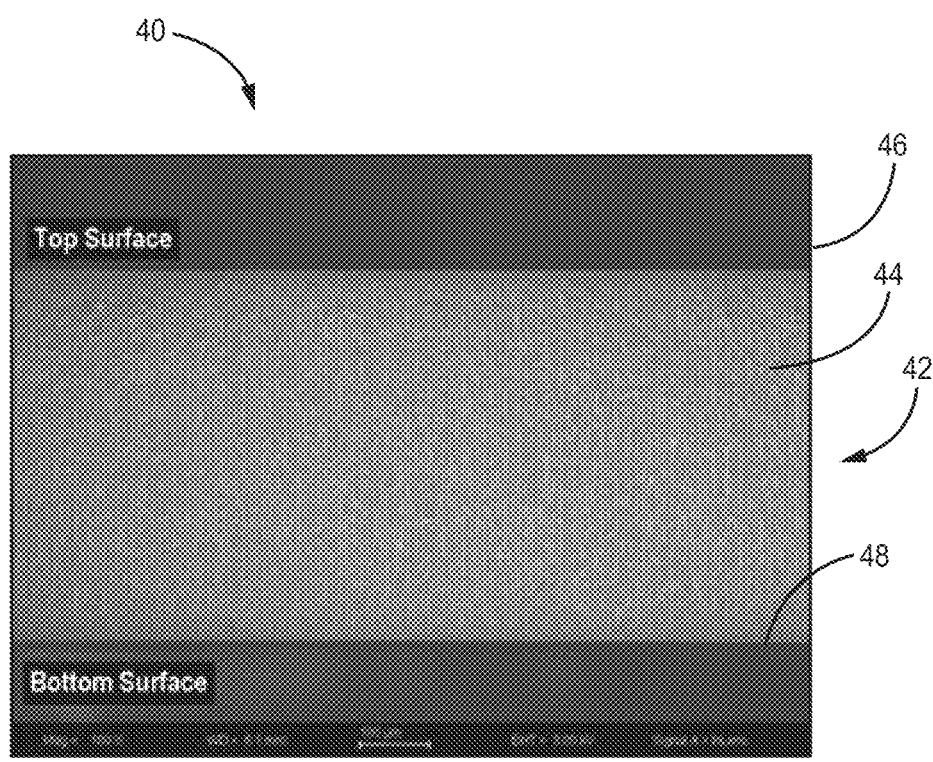
FIG. 5 shows an example scanning electron microscope (SEM) image showing a characteristic edge resulting from one or more laser line focus cutting process embodiments according to one or more embodiments described and illustrated herein.

If the substrate has enough stress in it, as in the case of many ion-exchanged glasses, cracks will propagate from one defect site to another without the need for any further process steps. But if the substrate has low stress, such as in the case of display glasses such as Corning Eagle XG or pre-ion exchange glasses, then further stress can be applied to fully form the cracks between the damage sites. In one embodiment, for example, this can be done by tracing the same perforated (defect) pattern using an infrared laser, such as a carbon dioxide ($CO_2$) laser. This creates a thermal stress that enhances the propagation of the crack, resulting in two separate pieces. An image showing glass that has defects created but has not yet been separated is shown in FIG. 4. An image showing the resulting edge post-separation is shown in FIG. 5.

Figure 2A:
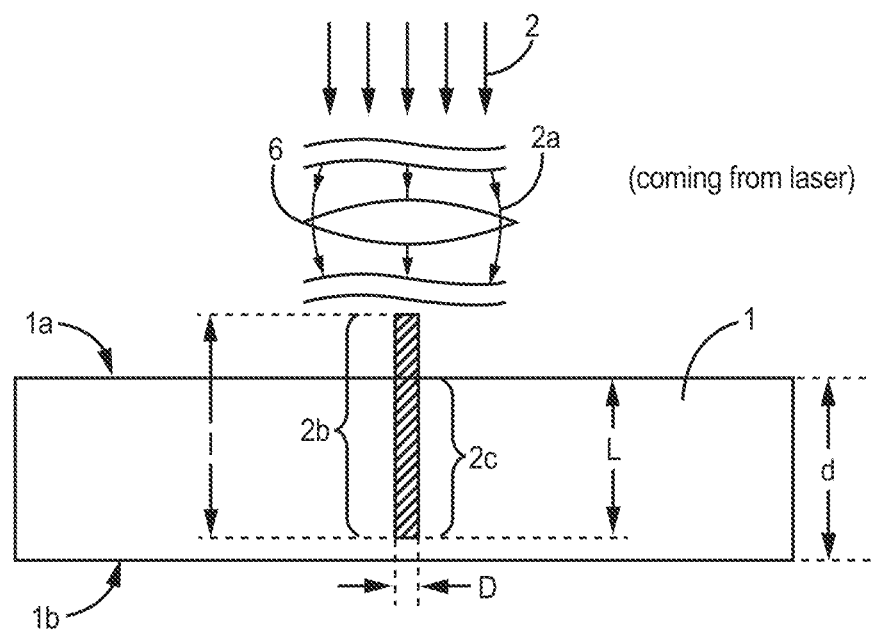
FIG. 2A is a schematic illustration of example laser processing components of a laser processing assembly to form defects within the substrate sheets according to one or more embodiments described and illustrated herein.
Figure 2B:
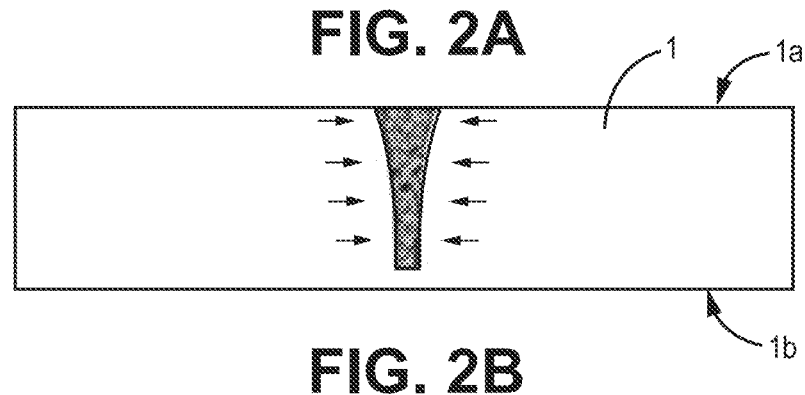
FIG. 2B is a schematic illustration of a side view of a substrate sheet depicting the formation of a defect line due to the induced absorption along a focal line created by the laser processing components depicted in FIG. 2A according to one or more embodiments described and illustrated herein.

Turning to FIGS. 2A and 2B, another embodiment of an optical system and method of laser processing a material includes focusing a pulsed laser beam 2 into a laser beam focal line 2b oriented along the beam propagation direction. The substrate 1 (e.g., a glass substrate sheet) is substantially transparent to the laser wavelength when the absorption is less than about 10%, preferably less than about 1% per mm of material depth at this wavelength. As shown in FIG. 2A, laser (not shown) emits laser beam 2, which has a portion 2a incident to an optical assembly 6. The optical assembly 6 turns the incident laser beam into an extensive laser beam focal line 2b on the output side of the optical assembly 6 over a defined expansion range along the beam direction (length l of the focal line). The planar substrate 1 is positioned in the beam path to at least partially overlap the laser beam focal line 2b of laser beam 2. The laser beam focal line is thus directed into the substrate.

Reference 1a designates the surface of the planar substrate facing the optical assembly 6 or the laser, respectively, and reference lb designates the reverse surface of substrate 1. The substrate or material thickness (in this embodiment measured perpendicularly to the planes 1a and 1b, i.e., to the substrate plane) is labeled with d.

As FIG. 2A depicts, substrate 1 is aligned perpendicular to a longitudinal beam axis and thus behind the same focal line 2b produced by the optical assembly 6 (the substrate is perpendicular to the plane of the drawing). The focal line being oriented or aligned along the beam direction, the substrate is positioned relative to the focal line 2b in such a way that the focal line 2b starts before the surface 1a of the substrate and stops before the surface lb of the substrate, i.e. still focal line 2b terminates within the substrate and does not extend beyond surface 1b. In the overlapping area of the laser beam focal line 2b with substrate 1, i.e., in the substrate material covered by focal line 2b, the extensive laser beam focal line 2b generates (assuming suitable laser intensity along the laser beam focal line 2b, which intensity is ensured by the focusing of laser beam 2 on a section of length l, i.e. a line focus of length l) an extensive section 2c (aligned along the longitudinal beam direction) along which an induced absorption is generated in the substrate material. The induced absorption produces defect line formation in the substrate material along section 2c. The defect line is a microscopic (e.g., >100 nm and <0.5 micron in diameter) elongated "hole" (also called a perforation or a defect line) in the substrate using a single high energy burst pulse. Individual defect lines can be created at rates of several hundred kilohertz (several hundred thousand defect lines per second), for example. With relative motion between the source and the substrate, these holes can be placed adjacent to one another (spatial separation varying from sub-micron to many microns as desired). The defect line formation is not only local, but over the entire length of the extensive section 2c of the induced absorption. The length of section 2c (which corresponds to the length of the overlapping of laser beam focal line 2b with substrate 1) is labeled with reference L. The average diameter or extent of the section of the induced absorption 2c (or the sections in the material of substrate 1 undergoing defect line formation) is labeled with reference D. This average extent D basically corresponds to the average diameter 6 of the laser beam focal line 2b, that is, an average spot diameter in a range of between about 0.1 micron and about 5 microns.

As FIG. 2A shows, the substrate material (which is transparent to the wavelength λ of laser beam 2) is heated due to the induced absorption along the focal line 2b arising from the nonlinear effects associated with the high intensity of the laser beam within focal line 2b. FIG. 2B illustrates that the heated substrate material will eventually expand so that a corresponding induced tension leads to micro-crack formation, with the tension being the highest at surface 1a.

The selection of a laser source is predicated on the ability to create multi-photon absorption (MPA) in transparent materials. MPA is the simultaneous absorption of two or more photons of identical or different frequencies in order to excite a molecule from one state (usually the ground state) to a higher energy electronic state (ionization). The energy difference between the involved lower and upper states of the molecule can be equal to the sum of the energies of the two or more photons. MPA, also called induced absorption, can be a third-order process, for example, that is several orders of magnitude weaker than linear absorption. MPA differs from linear absorption in that the strength of induced absorption can be proportional to the square or cube of the light intensity, for example, instead of being proportional to the light intensity itself Thus, MPA is a nonlinear optical process.

Representative optical assemblies 6, which can be applied to generate the focal line 2*b*, as well as a representative optical setup, in which these optical assemblies can be applied, are described below. Identical references are used for identical components or features or those which are equal in their function.

In the embodiment shown in FIG. 2A, in order to achieve the required numerical aperture, the optics must, on the one hand, dispose of the required opening for a given focal length, according to the known Abbé formulae (N.A.=n sin (theta), n: refractive index of the glass or other material to be processed, theta: half the aperture angle; and theta=arctan (D/2f); D: aperture, f: focal length). On the other hand, the laser beam must illuminate the optics up to the required aperture, which is typically achieved by means of beam widening using widening telescopes between the laser and focusing optics.

The spot size should not vary too strongly for the purpose of a uniform interaction along the focal line. This can, for example, be ensured (see the embodiment below) by illuminating the focusing optics only in a small, circular area so that the beam opening and thus the percentage of the numerical aperture only vary slightly.

Figure 3:
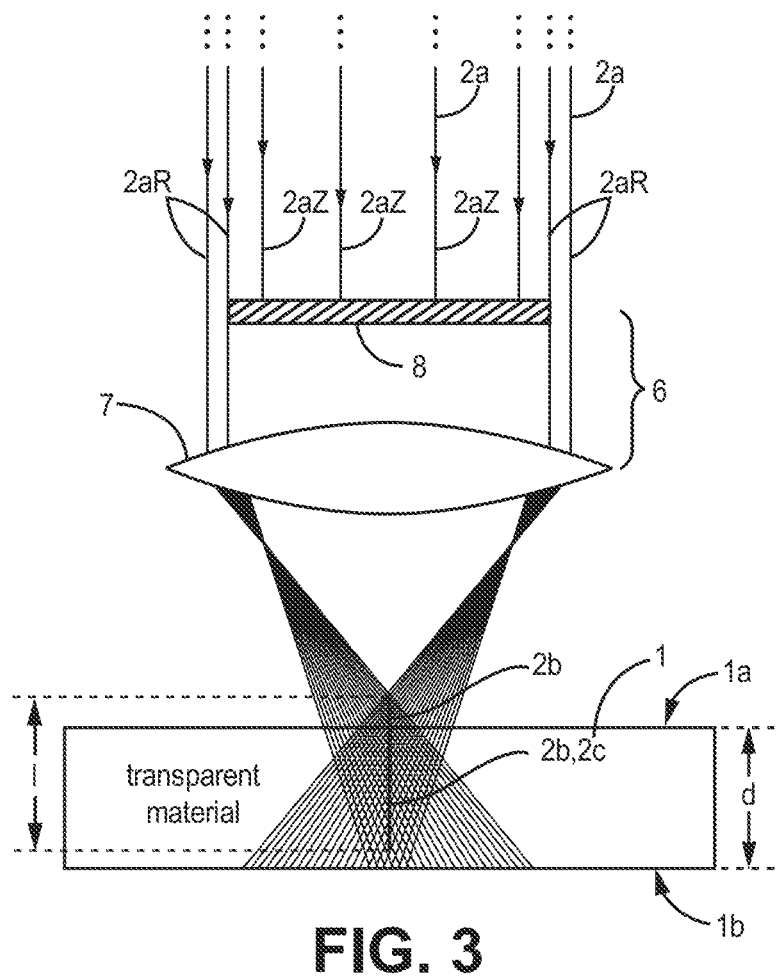
FIG. 3 is a schematic illustration of example laser processing components of a laser processing assembly to form defects within the substrate sheets according to one or more embodiments described and illustrated herein.

According to FIG. 3 (section perpendicular to the substrate plane at the level of the central beam in the laser beam bundle of laser radiation 2; here, too, laser beam 2 is perpendicularly incident to the substrate plane, i.e. incidence angle is 0° so that the focal line 2*b* or the extensive section of the induced absorption 2*c* is parallel to the substrate normal), the laser radiation 2*a* emitted by the laser is first directed onto a circular aperture 8 which is completely opaque to the laser radiation used. Aperture 8 is oriented perpendicular to the longitudinal beam axis and is centered on the central beam of the depicted beam bundle 2*a*.

The diameter of aperture 8 is selected in such a way that the beam bundles near the center of beam bundle 2*a* or the central beam (here labeled with 2*a*Z) hit the aperture and are completely absorbed by it. Only the beams in the outer perimeter range of beam bundle 2*a* (marginal rays, here labeled with 2*a*R) are not absorbed due to the reduced aperture size compared to the beam diameter, but pass aperture 8 laterally and hit the marginal areas of the focusing optic elements of the optical assembly 6, which, in this embodiment, is designed as a spherically cut, bi-convex lens 7.

As illustrated in FIG. 3, the laser beam focal line 2*b* is not only a single focal point for the laser beam, but rather a series of focal points for different rays in the laser beam. The series of focal points form an elongated focal line of a defined length, shown in FIG. 3 as the length 1 of the laser beam focal line 2*b*. Lens 7 is centered on the central beam and in this embodiment is designed as a non-corrected, bi-convex focusing lens in the form of a common, spherically cut lens. The spherical aberration of such a lens may be advantageous. As an alternative, aspheres or multi-lens systems deviating from ideally corrected systems, which do not form an ideal focal point but a distinct, elongated focal line of a defined length, can also be used (i.e., lenses or systems which do not have a single focal point). The zones of the lens thus focus along a focal line 2*b*, subject to the distance from the lens center. The diameter of aperture 8 across the beam direction is approximately 90% of the diameter of the beam bundle (defined by the distance required for the intensity of the beam to decrease to $1/e^2$ of the peak intensity) and approximately 75% of the diameter of the lens of the optical assembly 6. The focal line 2*b* of a non-aberration-corrected spherical lens 7 generated by blocking out the beam bundles in the center is thus used. FIG. 3 shows the section in one plane through the central beam, and the complete three-dimensional bundle can be seen when the depicted beams are rotated around the focal line 2*b*.

It may be advantageous to position the focal line 2*b* in such a way that at least one of surfaces 1*a*, 1*b* is covered by the focal line, so that the section of induced absorption 2*c* starts at least on one surface of the substrate.

U.S. Pub. No. 2015/0166396 discloses additional embodiments for creating the laser focal line for drilling holes into substrates that may be utilized. It should also be understood that other laser drilling methods that do not use a laser focal line may also be utilized.

FIG. 4 depicts an example microscope image 30 of a substrate 32 showing a crack 34 connecting laser formed defects 36 or perforations. The crack 34 and laser formed defects may be used to cut or score the substrate 32. In one embodiment, for example, a pitch between defects in a glass substrate may be less than 10 μm, although other measurements are contemplated and may vary depending on characteristics of any given substrate. The defects 36 or perforations, for example, may be disposed generally in a closed boundary or perimeter around a desired shape of a component and provide the second set of defects described above to cut or score the substrate 32 into one or more component(s). The closed boundary, for example, may comprise a closed boundary formed entirely by the second set of defects and cracks connecting them or may be formed by a combination of the second set of defects and one or more edges of the overall substrate 32 where components formed from the substrate include edges in common with the overall substrate 32.

FIG. 5 shows an example scanning electron microscope (SEM) image 40 showing a characteristic edge 42 resulting from one or more laser line focus cutting process embodiments described herein. In this particular example, a series of damage tracks or defects 44 (e.g., the second set of defects forming a boundary or perimeter) are seen that each pass through an entire thickness of a glass substrate from a top surface 46 to a bottom surface 48, giving the separated edge of the glass substrate a corrugated or serrated texture.

Such a corrugated or perforated edge has unique characteristics. To the eye, it has a frosted or lightly polished appearance. When viewed under a microscope, the edge can easily be characterized by the striations which are created from the line defects, giving the edge a corrugated texture. The pitch of these line defects determines the spacing of the striations. Again, these can easily been seen with an optical microscope. The edge has many desirable properties, including low sub-surface damage extending into the cut piece (e.g., typically less than 100 microns), good and extremely consistent edge strength (e.g., typically greater than 100 MPa, often greater than 150 MPa; with a variance often less than 10 MPa), and a 90 degree profile.

Figure 6:
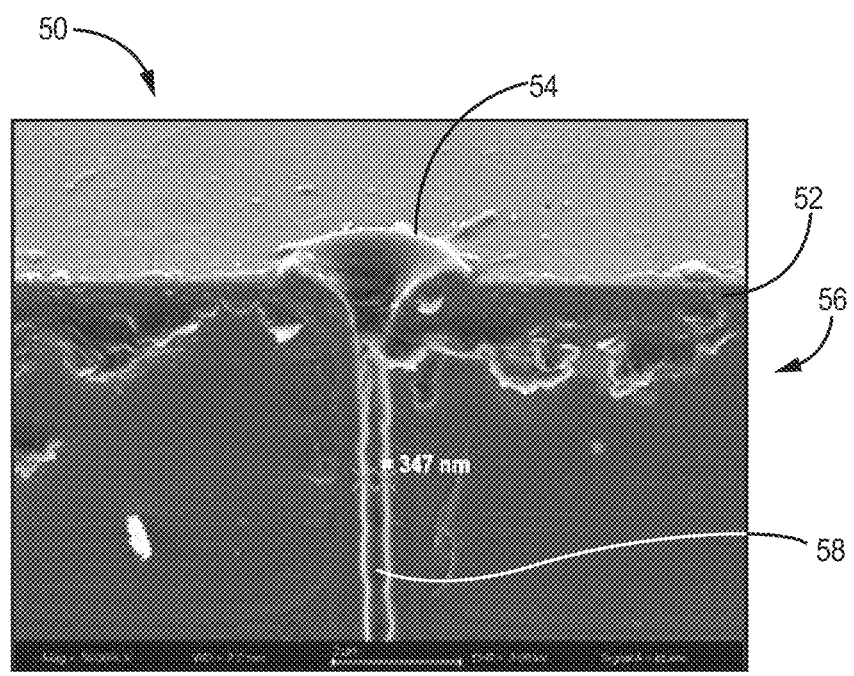
FIG. 6 shows the example SEM image of the entrance side of an individual defect in a glass substrate, such as may be formed by one or more laser line focus cutting process according to one or more embodiments described and illustrated herein.

If these perforations are spaced much further apart (e.g. 20 microns or greater), no interconnecting cracks form (depending on the substrate). In FIG. 6, an example SEM image 50 shows what the defects or perforations look like where the laser beam enters the glass. These defects or damage tracks (or pilot holes) are very small, on order of a 350 nm diameter. These defects can be enlarged using further processing with chemical etching to create micron sized holes. Side profiles of such perforations or holes are shown both before and after etch in FIG. 7. Such etching can be with an acid mixture, such as a 5% HF/10% $HNO_3$ solution, or with basic solutions, such as KOH or NaOH. In all cases, the etchant preferentially penetrates the damage tracks formed by the laser, allowing them to expand radially as a function of exposure time to the etchant.

FIG. 6 shows the example SEM image 50 of the entrance side 52 of an individual defect 54 in a glass substrate 56, such as may be formed by one or more laser line focus cutting process as described herein. The defect 54, for example, may correspond to one of a first set of defects formed in the substrate to provide a hole, via, interposer or the like within a perimeter of other defects or perforations (e.g., the second set of defects). In this example SEM image 50, for example, the individual defect 54 comprises an open hole or channel 58 is seen extending into the substrate 56 from the entrance side 52 of the substrate 56. In this particular example, the channel 58 is approximately 350 nm.

Figure 7:
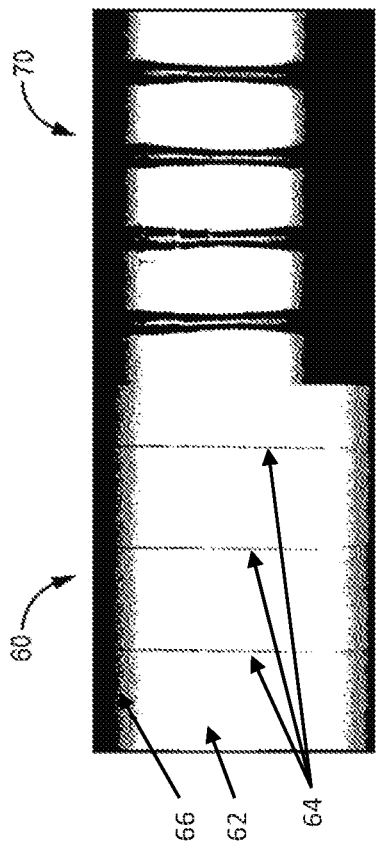
FIG. 7 shows example pre-etch and post-etch microscope images of a glass substrate according to one or more embodiments described and illustrated herein.

FIG. 7 shows example pre-etch 60 and post-etch 70 SEM images of a glass substrate 62. In this particular example, pre-etch image 60 shows a plurality of focus line laser perforations 64 made in the substrate 62 (in this embodiment, a 300 μm thick Eagle XG (EXG) glass substrate sold by Corning) with a focus line laser method. The pre-etch SEM image 60 is taken looking through a cleaved edge 66 of a piece of glass substrate 62. The perforations/holes 64, in this particular image, are located approximately 200 μm inside the edge 66 of the glass substrate 62, and extend through the entire thickness of the substrate. FIG. 7 shows slight distortions of the image from the non-flat surface of the mechanically cleaned edge 66. The post-etch SEM image 70 shows the same perforations 64', which have been enlarged to approximately 50 μm in diameter using a wet etch with a mixture of HF and $HNO_3$. It is also possible to place the line focus laser beam significantly higher or lower with respect to the substrate, forming blind holes which do not extend all the way through the thickness of the substrate. These holes can be etched in a similar manner as described above, to create blind vias, which are sometimes preferred for downstream processing such as metallization.

Figure 8:
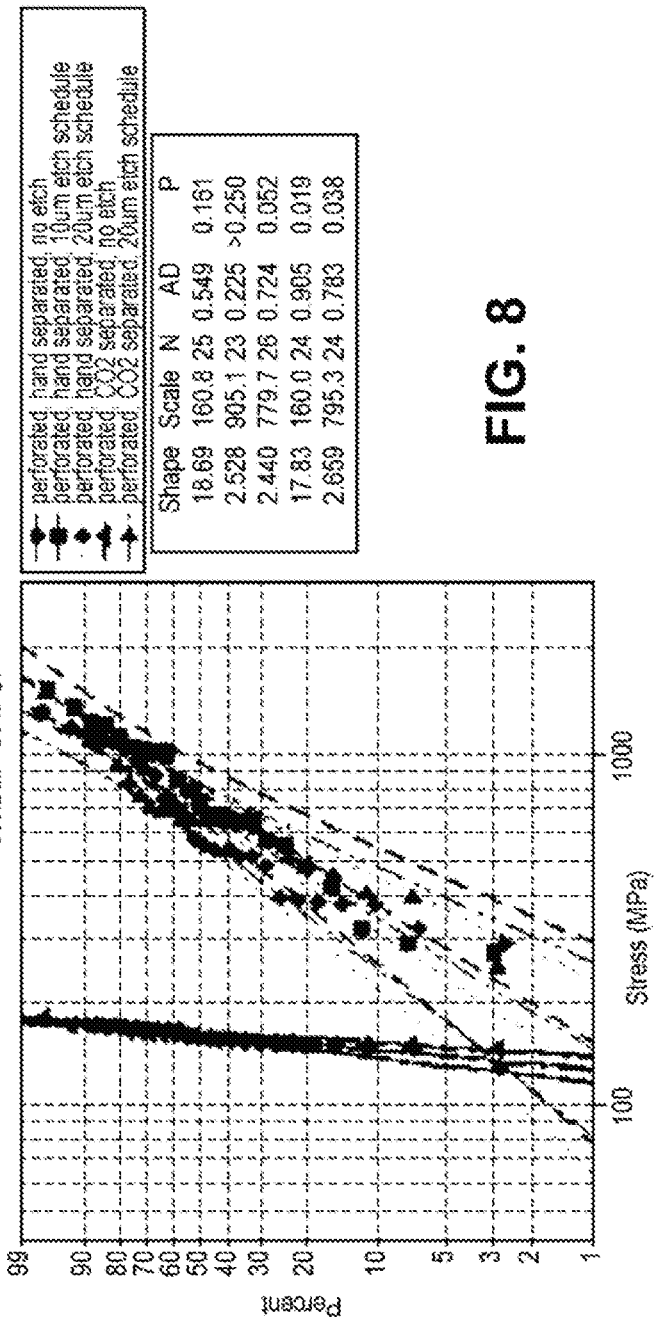
FIG. 8 shows example Weibull plots of the resultant edge strength, measured on 130 um thick Eagle XG glass, using a two-point bend test method according to one or more embodiments described and illustrated herein.

Furthermore, since the pilot holes are etched in order to produce the final open hole diameters, the edge strength of the cut edges will also be increased. FIG. 8 shows Weibull plots of the resultant edge strength, measured on 130 um thick EXG glass, using a two-point bend test method. As-cut, the edge strength of the glass parts has a B10 value of approximately 145 MPa, and the data has a very steep slope indicating a very consistent edge, characteristic of this cutting method. After acid etching, the edge strength is increased due to the removal of some of the damage present from the cutting process and due to the acid blunting of checks or cracks in the glass. This results in B10 edge strength values of approximately 300-400 MPa after only 10 um of etching or more, which is the minimal amount of etching generally needed to make holes for interposers. Such strength is much greater than the typical edge strength on wafers fabricated using by pure mechanical cutting and edge grinding methods, meaning that the laser cut parts plus acid etch will exceed typical downstream process edge strength requirements.

Cutting of glass involves a number of tunable parameters. Foremost are the laser parameters, which include the laser repetition frequency (kHz), burst number (B), pulse energy (uJ,), the line focus length which is often controlled by the focal length of a final objective lens, and focus location relative to the substrate. The pulse energy and the speed of the process in generating perforations at the substrate are directly tied to the frequency. The burst number is useful in influencing the strength of the laser material interaction and thus the magnitude of microcracks that form around the defect. A microcrack, as used herein, refers to a radial crack that is formed in the substrate from about a center of the defect. Microcracks are less than or equal to about 20 um and may or may not extend all the way through a thickness of the substrate. Where defects are used to cut or score the substrate, microcracks help by weakening the substrate.

A threshold value in pulse energy is required to modify the material, depending on the substrate, and it influences the magnitude of the microcracks that form around the defects. The final objective lens used in the optical delivery changes the length and energy density of the line focus. The last parameter is the pitch of the defects, which impacts the connection any perforations to form a part contour, and is determined by the coordination of the laser triggering and the stage movement.

For the cutting of a glass substrate, the following perforation parameters shown in Table 1 were found to produce consistent separation of cut parts, along with good edge strength (greater than 100 MPa) as-cut. NIX indicates glass laser processed pre ion-exchange, and IOX indicates the same glass, but processed with the laser post ion-exchange, 2318 and 2319 indicate Corning glass composition codes for two types of ion-exchangeable glasses.

TABLE 1

| Material | Pulse Energy (uJ) | Pulses/ Burst | Pitch (microns) | Objective Lens Focal Length (mm) | Line Focus Length (mm) |
| --- | --- | --- | --- | --- | --- |
| EXG, 100-200 um thick | 150-250 | 2-3 | 1-2 | 30 | 1 |
| EXG 700 um thick | 350-450 | 5-12 | 7-10 | 30 | 1.3 |
| NIX 2318 300 um thick | 150-200 | 2-5 | 3-5 | 50 | 2.5 |
| NIX 2318 700 um thick | 150-250 | 2-5 | 3-5 | 50 | 2.5 |
| IOX 2319, 700 um thick | 150-225 | 2-5 | 6-11 | 40 | 1.8 |

The above conditions shown in Table 1 do not represent all possible parameter ranges that may be used to cut the above materials, but instead are exemplary parameters which produce the good results for consistent part cutting, easy separation with subsequent application of a $CO_2$ laser, and good edge strength.

For the $CO_2$ laser separation, it was found that approximately 50 to 100 W of laser power focused to approximately 2 to 6 mm diameter spot at the glass, was sufficient to induce separation of the pre-perforated contours at speeds of approximately 100 to 250 mm/sec. In all cases, there is a tradeoff between desired separation speed, focus spot size, and laser power. For faster separation speeds, higher laser powers could be used, and for larger spot diameters, higher laser powers can also be used. For slower separation speeds, laser power can be decreased and/or spot size increased to avoid thermal ablation of the glass surface.

In the last case of Table 1 (IOX 2319), the glass is already ion-exchanged, so it has considerable tensile stress and will separate immediately upon perforation of a contour, and hence requires no $CO_2$ thermal exposure to separate.

Figure 9:
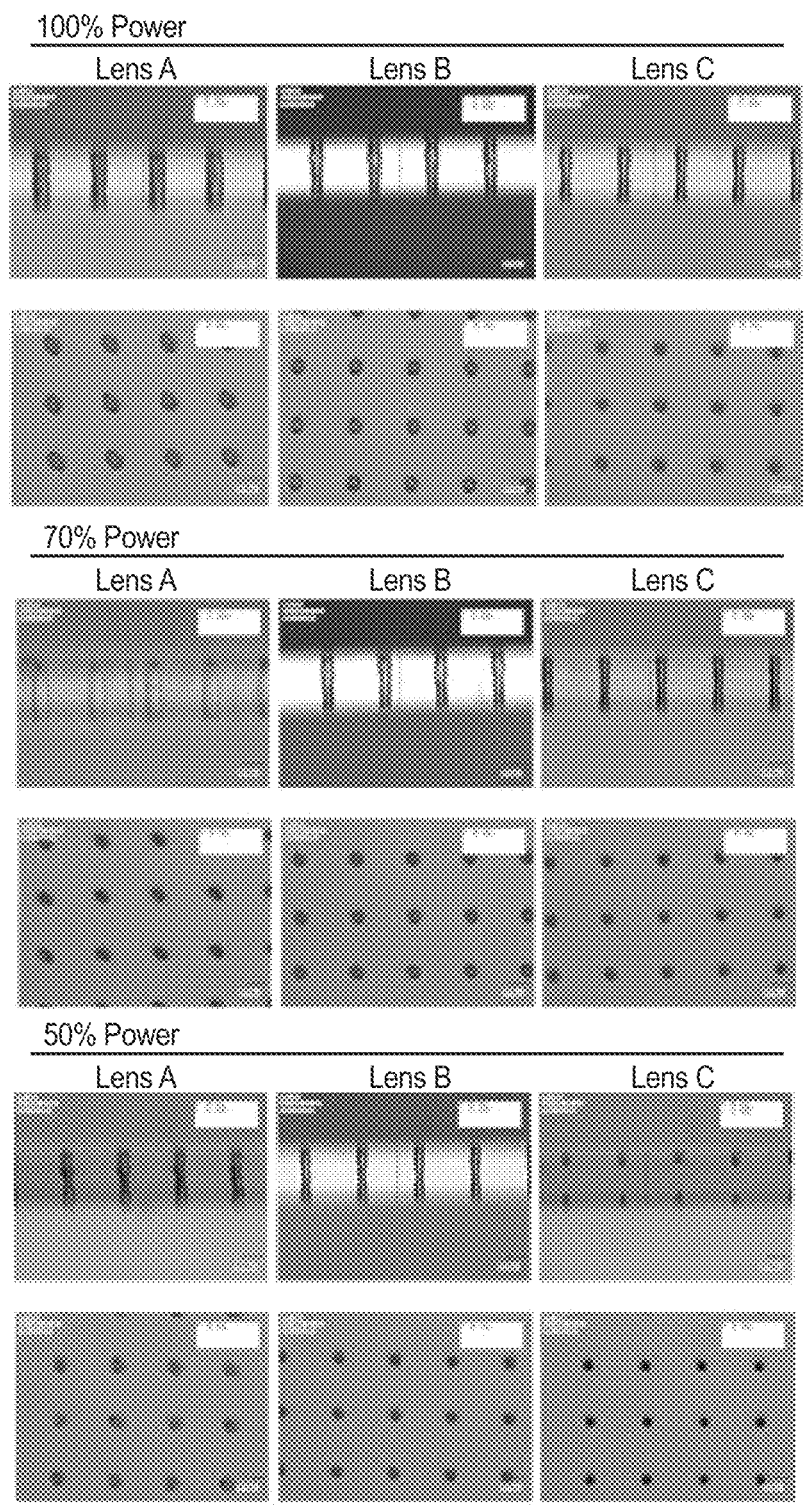
FIG. 9 shows example results of a process study for drilling an example glass substrate, where the pulse energy and the focal length of the final objective lens were varied to show effects according to one or more embodiments described and illustrated herein.
Figure 10:
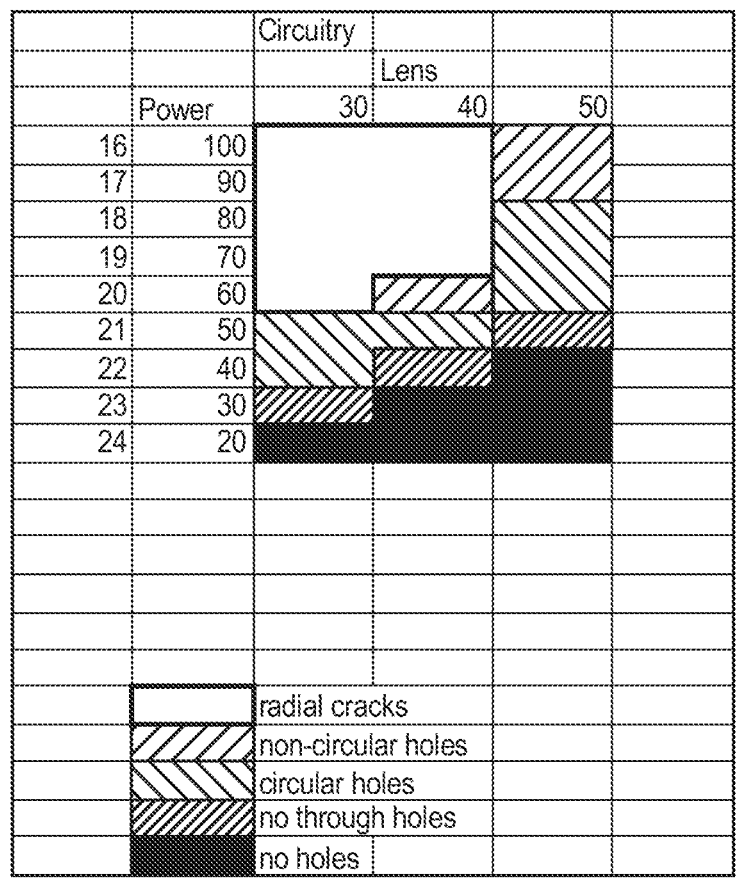
FIG. 10 shows an example chart illustrating results of the study shown in FIG. 9 according to one or more embodiments described and illustrated herein.

To obtain good results for drilling of the glass, round (circular) holes are generally desired for metallization processes, and the micro-cracking of the material should be reduced or minimized in order to increase or maximize part strength and reliability. Hence there is a trade-of between making a strong damage track through the substrate which will results in an easy path for etchant vs, causing too much damage to the material which will create a non-ideal hole shape. FIG. 9 shows the results of a process study for drilling 300 um thick EXG glass, where the pulse energy and the focal length of the final objective lens were varied to show these effects. The images show the top and side vies of holes, post etch. For this experiment, 100% power corresponded to about 185 uJ of energy per burst, and all conditions were at 2 pulses/burst. For lens A, the approximate line focus length was 1.3 mm, for lens B, about 1.8 mm, and for lens C, about 2.5 mm For the smallest focal length and highest pulse energies, radial cracks are formed around the holes which etch out into oblong features, creating elliptical holes as seen in the top images (e.g., Lens A, 100% power). For the lowest pulse energies, the damage tracks through the material are not strong enough to allow rapid penetration of etchant, and true through holes are not observed post-etch (e.g. Lens C, 50% power). The results are summarized in FIG. 10. The best compromise conditions are shown using the designation "circular holes," which uses a diagonal cross-hatching from top-left corner to bottom-right corner, where the power (pulse energy) is kept just above the threshold to damage the material but is not high enough to form large radial cracks that etch out into oblong holes. In general, the widest process window was observed for the longest line focus length (Lens C).

Similar results were observed for other materials, such as Corning codes 2318 or 2319 glass. Hence some good conditions for drilling/perforation are shown in Table 2 below.

TABLE 2

| Material | Pulse Energy (uJ) | Pulses/ Burst | Objective Lens Focal Length (mm) | Line Focus Length (mm) |
|---|---|---|---|---|
| EXG, 100- 300 um thick | 150-200 | 2-3 | 50 | 2.5 |
| NIOX (non-ion-exchanged) 2318, 700 um thick | 100-160 | 2-3 | 50 | 2.5 |
| NIOX 2319, 700 um thick | 100-160 | 2-3 | 50 | 2.5 |

Using the above mentioned process conditions, demonstrations were made of cutting and drilling wafer made out of 0.7 mm thick Corning code 2318 glass. The process was as follows:
1. A glass sheet of 300×300 mm was loaded into the machine.
2. A 200 mm wafer contour was perforated, along with release lines to facilitate removal of the extra glass pieces.
3. A $CO_2$ laser was used to separate the perforated contours.
4. A central hole pattern was exposed, with perforations.

The total time to both cut and laser expose a 320,000 hole pattern in this wafer was less than 5 minutes. This is much faster than if the wafer had to be mechanically cut and ground to shape, and in addition the cutting may be done to any size, meaning that the glass stock fed into the machine can be just blank large sheets, rather than requiring a different inventory be held for 100 mm wafer, 200 mm wafers, etc. Furthermore, since the glass wafer was not unloaded from the machine between the cutting and drilling, the placement of the hole pattern relative to the wafer cut edges is governed only by the stage accuracy, which in this example is approximately ±5 microns.

Other thicknesses and glass compositions have also been cut and drilled with suitable adjustments of perforation and separation process conditions, such as EXG, 2319 NIOX glass, and post-IOX glasses.

While the above demonstration used a single psec laser optical head to do both the cutting perforation and the drilling, it is also possible to do these processes with two optical heads in the same machine, or even two different machines. The advantage of employing two different optical heads is that slightly different line focus lengths may be optimal for cutting versus drilling; since in general more damage to the glass is desired for cutting processes to facilitate crack interconnection, whereas for drilling it is desirable to minimize damage to ensure that the final post-etch hole profiles are as round and smooth as possible. In such a case, as is illustrated in FIG. 11, a single laser beam source may be switched between two optical heads using an electro-optic (polarization based) switch, a mechanically actuated or rotated waveplate combined with a polarization beam splitter, or pneumatically or mechanically driven motion of a mirror.

Figure 11:
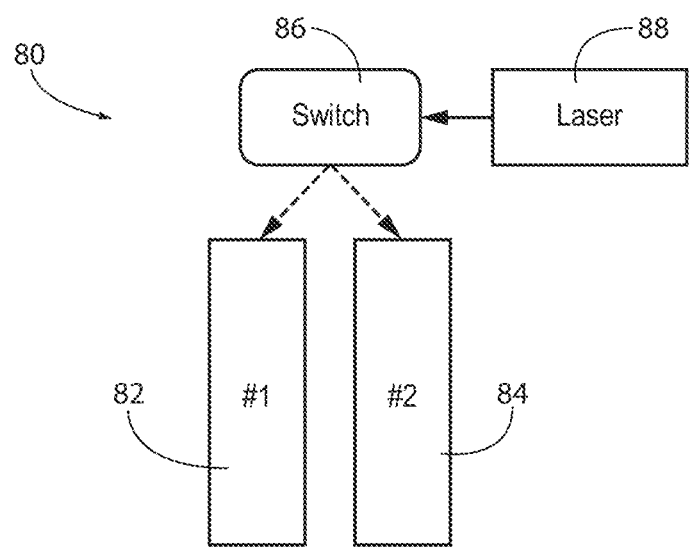
FIG. 11 schematically shows an example laser system employing two optical heads according to one or more embodiments described and illustrated herein.

FIG. 11 schematically shows an example laser system 80 employing two optical heads 82, 84. In this example embodiment, one optical head 82 may be configured optimally for cutting and a second optical head 84 may be configured optimally for drilling/forming holes in a substrate. An optical switch 86 may be used to select which head to be used at any given time within a process. The optical switch 86, for example, may comprise a pneumatically or mechanically actuated mirror, a rotatable waveplate combined with a polarization beamsplitter, or other optical element or an electro-optic switch that redirects a laser beam from a laser 88 by affecting a polarization state of the light being sent through a polarizing beam splitter.

Figure 12:
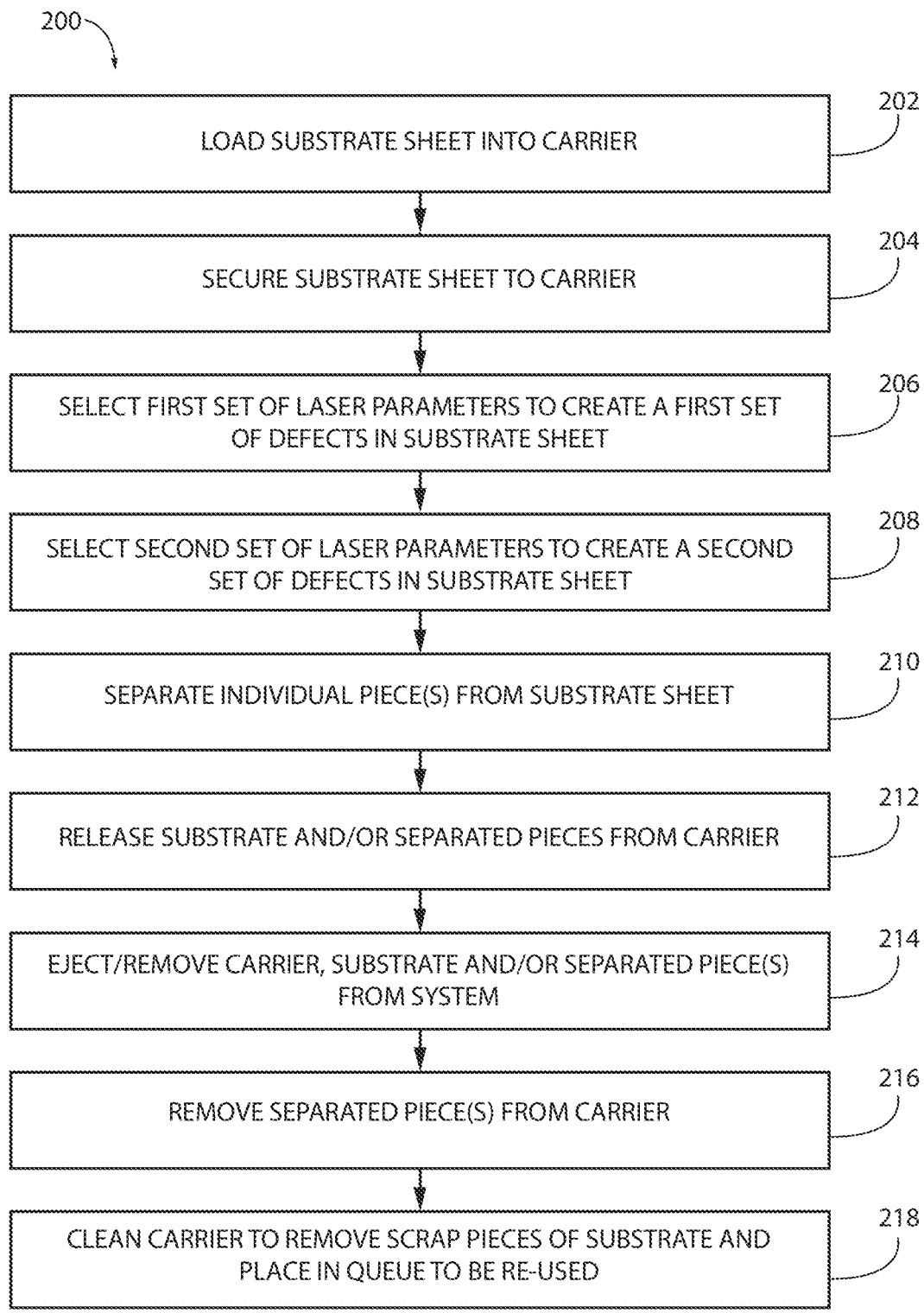
FIG. 12 shows a flow chart of an example process of fabricating a substrate using a focus line laser and/or a short pulse laser to fabricate the substrate according to one or more embodiments described and illustrated herein.

FIG. 12 shows a flow chart of an example process 200 of fabricating a substrate using a focus line laser and/or a short pulse laser to cut and/or drill a substrate, such as a glass sheet substrate. In the embodiment shown in FIG. 12, a substrate sheet is loaded into a carrier in operation 202. In this embodiment, for example, the system has stages that move the laser with respect to the glass by moving the glass or the optical delivery (or both). As described in more detail below with reference to FIGS. 13-17, the substrate sheet, for example, may comprise one or more discrete substrate sheets or a continuous web of substrate sheet material (e.g., fed from one or more rollers of the system). In operation 204, the substrate sheet is secured to a carrier, such as via a vacuum chuck. A first particular set of laser parameters are selected in operation 206 to create one or more specific internal defects (e.g., a first set of defects) corresponding to a desired shape, depth, size or other characteristic of the internal defect. A second particular set of laser parameters are selected in operation 208 to create one or more specific external defects (e.g., a second set of defects forming a boundary or perimeter around one or more desired individual components) corresponding to a desired shape, depth, size or other characteristic of the external defect. Individual shapes are separated from the substrate, such as via using a $CO_2$ laser, in operation 210. The substrate/separated pieces are released from the carrier in operation 212, such as by releasing the vacuum chuck. The carrier and pieces cut from the substrate sheet are ejected or otherwise removed from the system in operation 214, and the separated pieces are removed from the carrier in operation 216 by an automated and/or manual operation. The carrier is cleaned to remove scrap pieces of the substrate and placed in a queue to be re-used in operation 218. The order of the operations shown in FIG. 12 is merely an example. The cutting and drilling operations, for example, may be performed in either order on the same or different equipment as described herein. Further, as described above, depending on the characteristics of a particular substrate, the separation operation may or may not be performed with an additional $CO_2$ laser.

With the focus line laser process, the properties of the cut glass edge (strength, roughness, sub surface damage, etc.) are adequate without further grinding, beveling, and polishing. This reduces the amount of time and cost to produce the same product and eliminates any yield losses due to these processes. Furthermore, the number of washing steps is reduced. For the traditional process, a wash step is required after the wafers are cut and ground to remove mechanical debris. This step may be removed by the above process.

Since the same system cuts and drills the glass samples, in some embodiments, this also has an advantage of greatly increased positional accuracy between the exterior features and the hole pattern (e.g., interposer holes). With traditional methods, due to inaccuracies of mechanical cutting and grinding of the part edges, the total accuracy of a pattern placement to true center of a part is of order 200 um. The errors can be large even if a vision system is used to find the part edges before hole drilling. The process described herein, however, is able to create a laser processed part has much more precision an accuracy of exterior dimensions when compared to a mechanical ground and polish part. Hence cutting and drilling becomes not only a time savings feature but can significantly improve the accuracy specifications of the part, to absolute tolerances of approximately ±5 um.

In addition, one of the biggest difficulties in processing thin glass (glass thickness <200 microns) is manually handling the glass. Because the glass is so thin, it behaves like a piece of paper. This process reduces handling thus enabling thin glass processing. The complete system minimizes the manual handling of parts before and after drilling. In a traditional system, the parts are manually handled when they are cut and when they are loaded in and unloaded from the drilling system. With this process, the handling can be only when they are removed from the system, which has the potential to be automated. This leads directly to overall yield improvements.

Another advantage of processing a large sheet to make a series of individual parts is that the speed of the drilling process is limited by the speed the beam can be moved relative to the glass, not by the physics of the drilling process itself. If the process of moving glass is broken down further, the most time is taken up in the acceleration and deceleration stage. By combining many parts with the same pattern, the effective time per part can be reduced. By combining many parts on a panel, overall drill speed is increased when the laser beam is scanned across a large panel—there are fewer acceleration/deceleration events as are needed when handling only small parts.

Figures 13, 14:
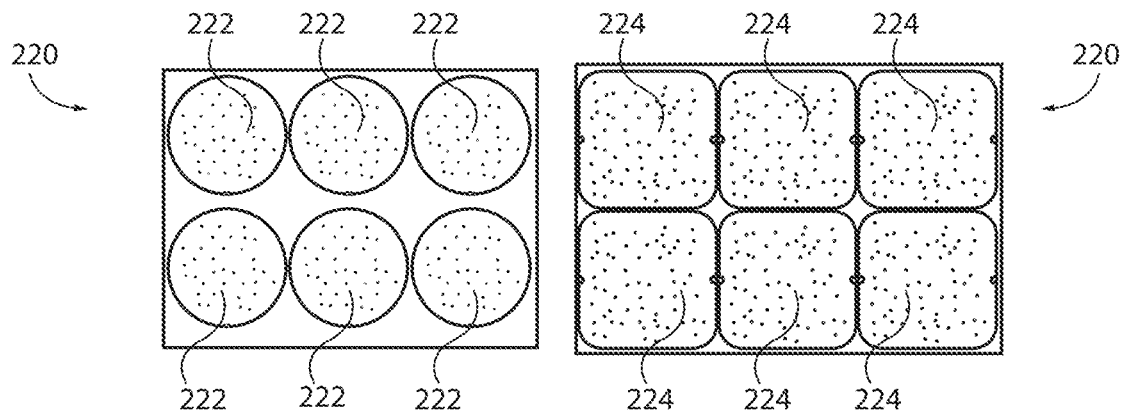
FIGS. 13 and 14 schematically show multiple wafers and panels with one or more desired patterns created out of a single larger panel according to one or more embodiments described and illustrated herein.

FIGS. 13 and 14 show that multiple wafers 222 and panels 224 with one or more desired patterns can be created out of a single larger panel 220. In this case, the laser process would be used to create a first set of defects corresponding to a hole pattern (e.g., pilot holes, vias, interposers or the like) and to create a second set of defects forming a boundary or perimeter such as forming a wafer contour, including any alignment fiducials within the part contours. This exterior wafer pattern of the second set of defects could be released using a separate laser process (e.g. $CO_2$ laser thermal separation) or released in a downstream process (acid etch). An advantage is that each desired piece can be arbitrary in size and dimensions and each piece can have different internal hole patterns. In FIGS. 13 and 14, for example, exterior boundaries or perimeters of individual wafers 222 (FIG. 13) and individual panels 224 are formed by a second set of defects disposed in a generally circular boundary or perimeter for the wafers 222 and in a generally rectangular boundary or perimeter of the panels 224. Further, a first set of defects provides interior holes (e.g., pilot holes, vias, interposers or the like) shown disposed within the boundaries or perimeters of the individual wafers 222 and panels 224.

Figure 15:
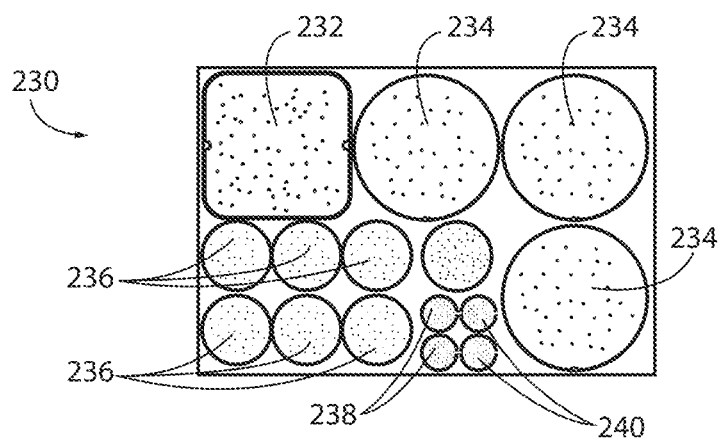
FIG. 15 schematically depicts an example layout where one sheet of glass is being cut into four different sizes with two different patterns according to one or more embodiments described and illustrated herein.

FIG. 15 depicts an example layout, where one sheet of glass is being cut into four different sizes with two different patterns. This is a particular advantage of a cut and drill process described herein, as the inventory of glass is simplified and the process is very versatile.

For instance, as shown in FIG. 15, in one substrate sheet 230, one panel 232, three 300 mm wafers 234, seven 150 mm wafers 236, and two 100 mm wafers 238 with a first pattern and two 100 mm wafers 240 with a second distinct pattern could be drilled at the same time from the single substrate sheet 230. A single large sheet of glass can be loaded and processed, instead of loading many individual wafers or sub-panels. In FIG. 15, for example, exterior boundaries or perimeters of individual wafers 234, 236, 238 and 240 and individual panels 232 are formed by a second set of defects disposed in a generally circular boundary or perimeter for the wafers 234, 236, 238 and 240 and in a generally rectangular boundary or perimeter of the panels 232. In addition, a first set of defects provides interior holes (e.g., pilot holes, vias, interposers or the like) shown disposed within the boundaries or perimeters of the individual wafers and panels.

In contrast, if parts are pre-cut to size, this mandates carrying a large inventory of wafers with various dimensions. Because many different sizes and thicknesses are required for different vendors, the inventory can be huge. The processes described herein have advantages of cutting wafers or panels from a single-sized mother sheet to obtain many different sizes of inventory pieces, reducing the necessary inventory to simply sheets (or spools) of different thicknesses. This reduces loading time, reduces part handling and tracking complexity, and increases production throughput.

Figure 16:
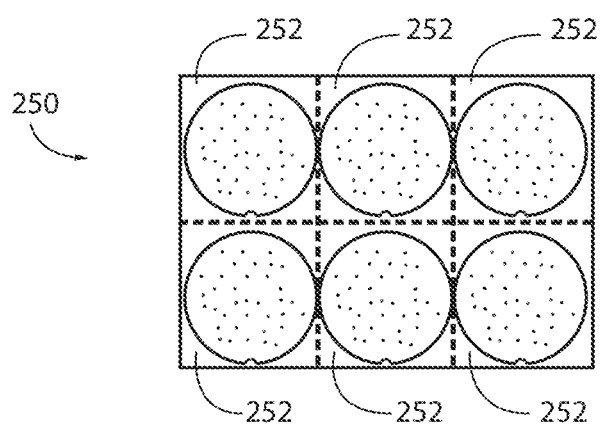
FIG. 16 schematically shows another example layout where multiple subpanels that contain wafers with a desired pattern can be created out of a single larger panel according to one or more embodiments described and illustrated herein.

FIG. 16 shows that multiple subpanels 252 that contain wafers with a desired pattern can be created out of a single larger panel 250. In this case, the laser process would be used to create an interposer pattern, such as via a first set of defects, and to create the wafer contour, including any alignment fiducials, such as via a second set of defects disposed forming a boundary or perimeter around the first set of defects. Additionally, the laser process may be used to create the subpanels 252. This subpanel pattern could be released using a separate laser process or released in a downstream process such as an acid etch.

Figure 17:
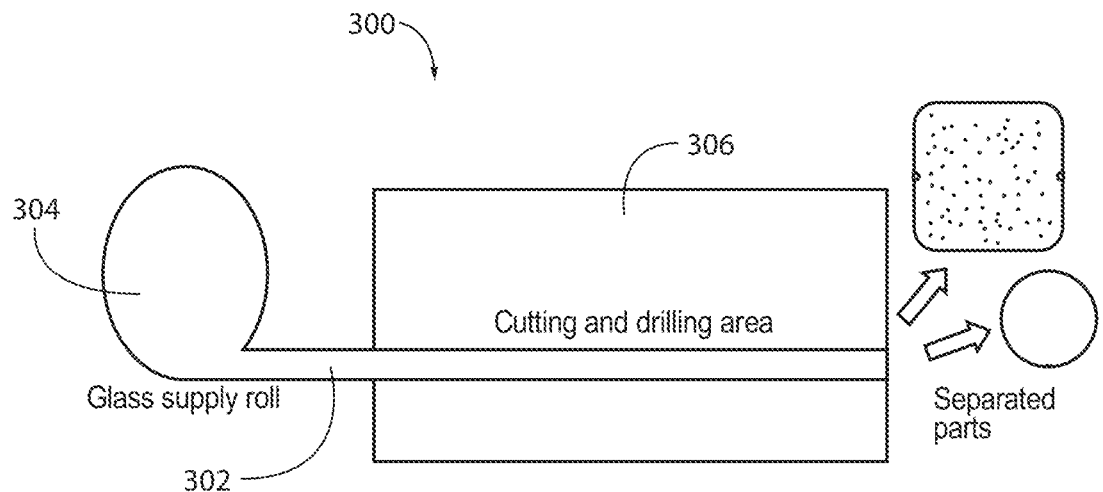
FIG. 17 schematically shows an example process and system for laser fabricating a substrate sheet according to one or more embodiments described and illustrated herein.

FIG. 17 schematically shows a process with feedstock supplied via a spool of substrate sheet (e.g., glass substrate sheet, such as Corning Willow glass). The ability to accept rolls decreases material handling and the need to convert rolls to panels. In the laser processing assembly, the system may perform cut, drill, and release processes. On the exit side of this system, a pick and place may be used to convey the desired parts away.

Referring to FIG. 17, an example process and system 300 for laser fabricating a substrate sheet 302 is schematically illustrated. Generally, the substrate sheet 302 is provided in a spool 304 prior to processing. As used herein, the term "substrate sheet" means a glass substrate sheet, a fused silica sheet, a sapphire sheet, a glass-ceramic substrate sheet, or a ceramic sheet. The glass substrate sheet may be fabricated from any glass material capable of being laser drilled and etched as described herein. Similarly, the glass-ceramic substrate sheet and the ceramic substrate sheet may be fabricated from any glass-ceramic or ceramic material capable of being laser drilled and etched as described herein. Example glass compositions would be Corning Eagle XG glass, or Corning Gorilla glass compositions such as Corning codes 2318, 2319 and 2320. Partially cerammed materials, such as those that have less than about 20% transmission loss for a particular laser may also be used.

As stated above, the substrate sheet 302 is capable of being drilled by a laser drilling process to create a first set of defects adapted to provide one or more pilot holes, vias, interposers or the like and a second set of defects or perforations disposed along a boundary or perimeter surrounding the first set of defects. Accordingly, the substrate sheet 302 should be capable of receiving thermal energy with minimal dimensional change so that substrate sheet 302 does not need to be secured to a support frame during laser processing. For example, polyimide film typically used for high temperature electronics applications may experience unpredictable distortion in the range of 10 μm to 100 μm when subjected to thermal cycles. By comparison, the substrates described herein, such as glass substrates, do not have detectable distortion when subjected to the same thermal cycles. In additional to dimensional stability, the substrate sheet 302 should be capable of withstanding temperatures greater than about 500° C., have a Young's modulus greater than about 50 GPa, and have a hardness of greater than about 3 GPa.

The substrate sheet 302 should have a thickness such that it is capable of being rolled into a spool, as shown in FIG. 17. In the case of a thin glass substrate, as a non-limiting example, the substrate sheet 302 may have a thickness of less than 300 μm. It should be understood that the substrate sheet 302 may take on other thicknesses depending on the composition and properties of the material.

The spool 304 is disposed on a spool assembly (not numbered) that mechanically rotates to unroll the substrate sheet 302, as depicted in FIG. 17. The spool assembly, as well as the other spool assemblies described herein, may be configured as any device capable of rotating and having the substrate sheet 302 rolled thereon.

In the illustrated embodiment, the substrate sheet 302 passes through a laser processing assembly 306 as it is unrolled from the spool 304. As described in more detail below, the laser processing assembly 306 comprises one or more lasers operable to laser-drill a plurality of defects (not shown in FIG. 17) on or through the substrate sheet 302 for cutting (e.g., a second set of defects) and/or drilling (e.g., a first set of defects) the substrate sheet 302. The defects may be through-holes, blind holes, defect lines, or damaged areas within the glass substrate formed by multi-photon absorption, as described in more detail below. Any laser process capable of forming laser-induced defects within the substrate sheet 302 may be utilized, depending on the end application and hole requirements. As an example, and not a limitation, the one or more lasers may be operable to produce a laser beam in the ultra-violet or infrared wavelength range. Example, non-limiting laser processing assemblies are illustrated in FIGS. 1, 2A and 2B and described in detail above.

It is noted that it is possible to process several substrate sheets simultaneously. For example, the spool 304 may include several rolled substrate sheets so that the multiple substrate sheets may be laser drilled simultaneously when arranged in a stacked relationship within the laser processing assembly 306.

In the example illustrated by FIG. 17, the substrate sheet 302 exits the laser processing assembly 306 already separated into individual component parts 308, 310. However, as described herein, the separation along perforations/defect lines may occur downstream of the laser processing assembly 306. Further, although the substrate sheet 302 is shown as a continuous sheet disposed on a roll, the substrate sheet may also be introduced into the laser processing assembly 306 in discrete substrate sheets for processing within the laser processing assembly 306.

Figure 19A:
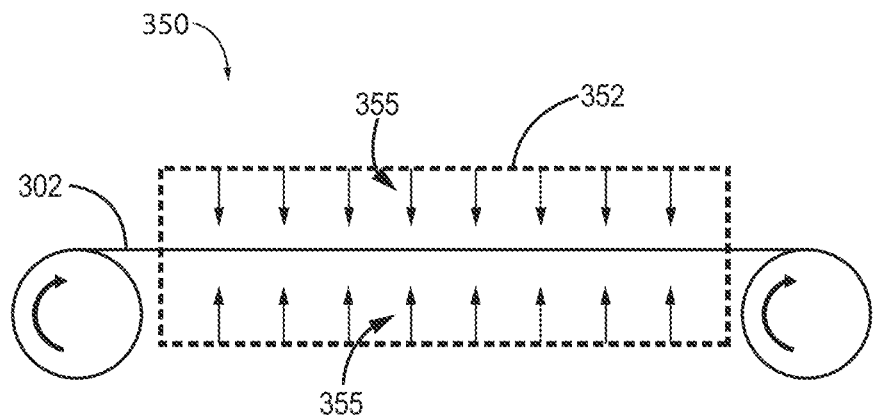
FIG. 19A is a schematic illustration of an example etching assembly according to one or more embodiments described and illustrated herein.
Figure 19B:
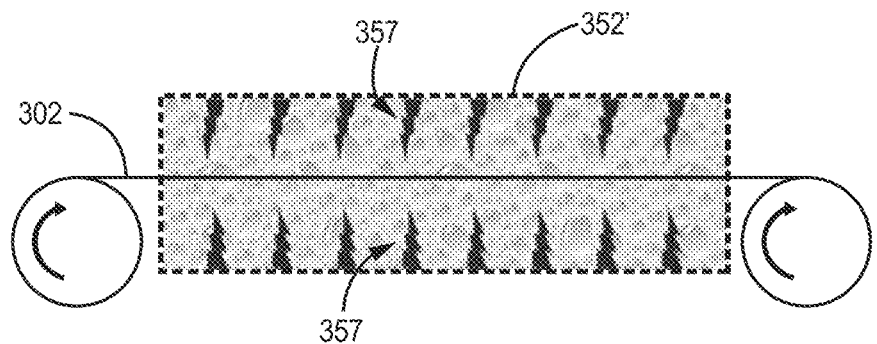
FIG. 19B is a schematic illustration of an example etching assembly according to one or more embodiments described and illustrated herein.
Figure 19C:
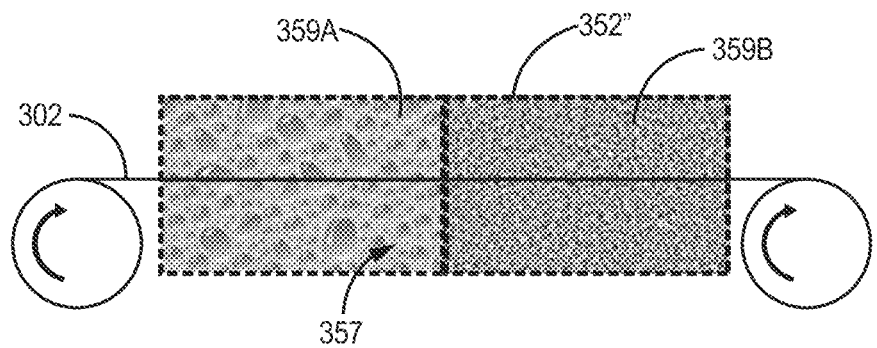
FIG. 19C is a schematic illustration of an example etching assembly according to one or more embodiments described and illustrated herein.
Figure 20A:
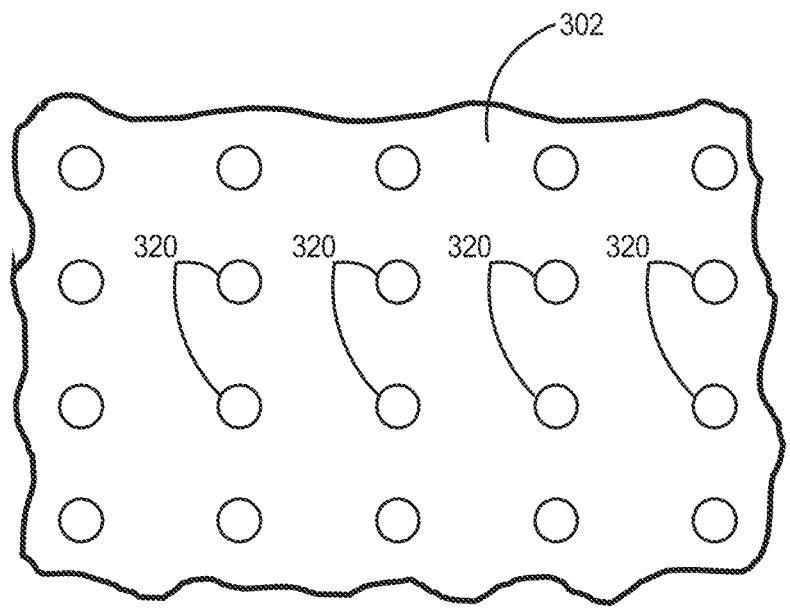
FIG. 20A is a schematic illustration of a partial view of a substrate sheet after fabrication of holes according to one or more embodiments described herein.
Figure 20B:
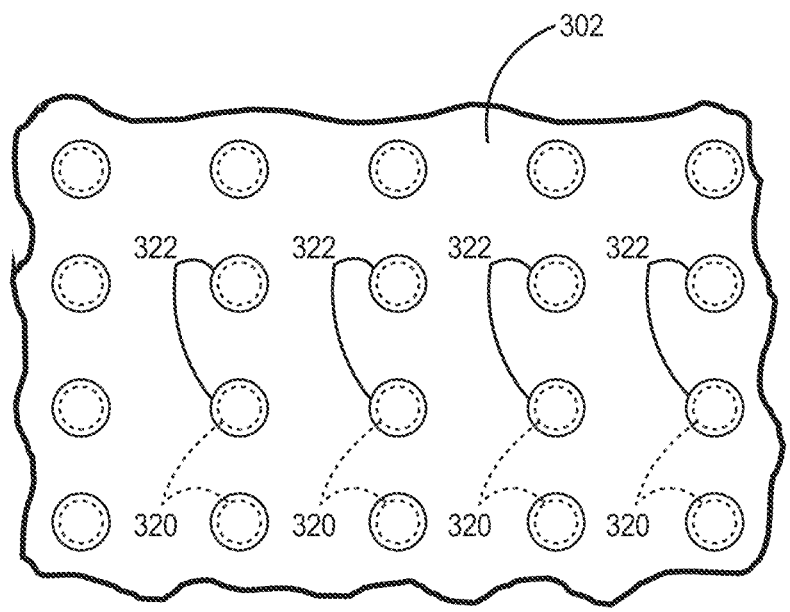
FIG. 20B is a schematic illustration of a partial view of a substrate sheet after metallizing the holes of FIG. 20A according to one or more embodiments described herein.

The process 300 may also include an etching process (e.g., for finishing holes within the substrate sheet) that is disposed within the laser processing assembly 306, in series with the laser processing assembly 306 or in a separate discrete location of the system/process downstream of the process 300 shown in FIG. 17. In an etching assembly, the substrate sheet or the discrete separated parts may be subjected to an etching process to open the defects created by the laser process to form the desired holes. Any known or yet-to-be developed etching process may be utilized to open or otherwise shape the holes into the desired shape. Example, not-limiting etching processes are schematically depicted in FIGS. 19A-19C and described in detail below. FIG. 20A depicts a plurality of holes 320 in a portion of a substrate sheet 302 following the etching process. The cross-sectional shape of the holes can vary from cylindrical, conical, or other shape depending on the application requirements. FIG. 20B, in turn, shows the substrate sheet 302 after the plurality of holes 320 have been filled with a metallization layer forming metallized contact pads 322 outside metal-filled holes 320.

Figure 18:
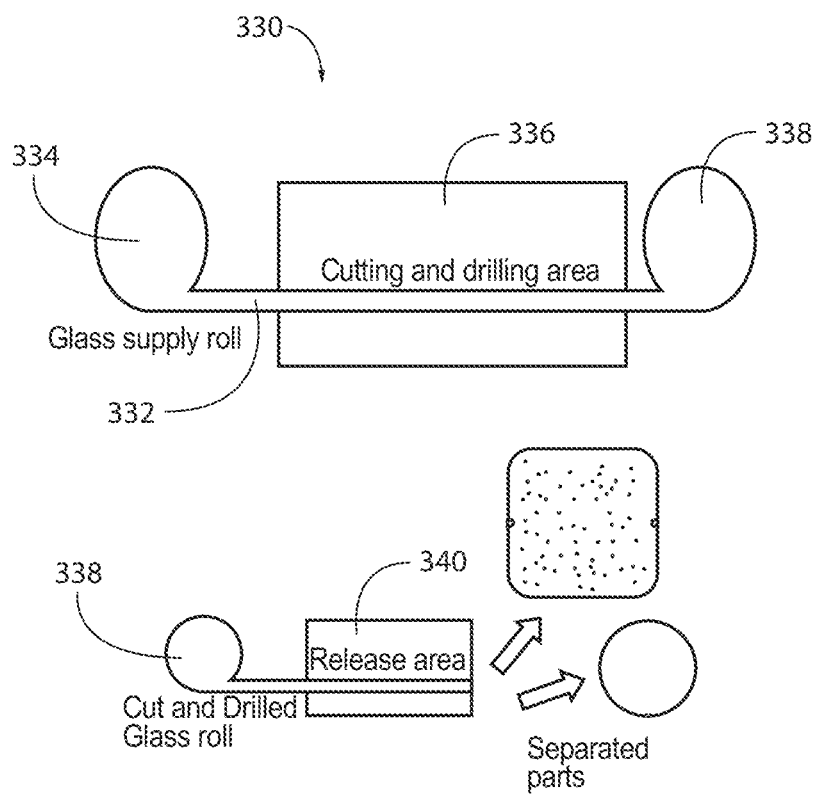
FIG. 18 schematically shows a roll to roll process for fabricating a substrate sheet according to one or more embodiments described and illustrated herein.

FIG. 18 shows schematically a roll to roll process 330, where an entire roll 334 of feedstock 332 is perforated and drilled in processing area 336 but not released, and is spooled 338 back up after the laser perforation. Note that a release operation 340 (e.g. CO2 laser exposure) simply allows cracks that were formed in the perforation process to propagate. Therefore, since the hole pattern and the part outlines are still all perforated in the same machine, there isn't a sacrifice to the dimensional tolerances incurred. The resulting part is identical and has all the desirable properties already outlined. The drilled and cut spool could then be acid etched and drop out the desired shape or run through a subsequent process, labeled "Release" in FIG. 18, to trace out and separate the desired shapes. This could be advantageous because the time to cut and drill for certain parts is a majority of the process time. By separating these steps, the overall throughput per production line could be much higher, making for lower capital investment per unit of throughput. For instance, one embodiment could be five machines each perforating contours and drilling five different rolls stock. These five rolls of cut and drilled stock would be sent to a single separation machine, which takes the spools and releases the parts.

Referring now to FIGS. 19A-19C, example etching processes 350 that may be provided by an etching assembly 352 are schematically illustrated. As stated above, any etching process capable of opening the laser drilled holes in the substrate sheet 302 may be used. Referring first to FIG. 19A, the example etching assembly 352 is configured to etch the advancing substrate sheet 302 by spray etching. A plurality of nozzles (not shown) directs a plurality of spray jets 355 of etching solution at the substrate sheet 302. Although FIG. 19A illustrates spray jets 355 on both sides of the substrate sheet 302, embodiments may also only direct spray jets 355 on one side of the substrate sheet 302. The fluid velocity of the spray jets 355 may vary along the length of the etching assembly 352.

FIG. 19B schematically illustrates an etching assembly 352' providing aqueous etching where in the substrate sheet 302 is submerged in etching solution. As noted above, any etching solution chemistry may be used depending on the properties of the substrate sheet 302. Although not shown in FIG. 19B, etchant-resistant rollers may be provided in the etching assembly 352' to push the substrate sheet 302 downward such that it is fully submerged in the etching solution. As shown in FIG. 19B, optical ultrasonic energy and/or agitation (represented by shapes 357) may be applied to the etching solution and/or the substrate sheet 302 to further encourage etching of the holes.

FIG. 19C schematically illustrates an etching assembly 352" providing multiple etching zones in the form of etching zones 359A and 359B. It should be understood that any number of etching zones may be provided depending on the application. In the illustrated embodiment, etching zone 359A is an aqueous etching zone (which may or may not provide ultrasonic energy or agitation) while subsequent etching zone 359B is a dry etching zone. It should be understood that other etching zones may be provided in lieu of, or in addition to, illustrated etching zones 359A and 359B. For example, the etching zones may provide spray processes or substrate submersion.

The different etching zones may be optimized specifically with different etch conditions. Fast changes in etch conditions is difficult to achieve in batch processing where individual sheets of substrates are etched. However, in a continuous or roll-to-roll process as described herein, sequential sets of spray nozzle can vary the etch composition, provide a water rinse, change temperature, add or remove agitation, and the like as the substrate sheet 302 advances through the etching assembly 352.

As noted above, each surface of the substrate sheet 302 may be processed independently. For example, both surfaces of the substrate sheet 302 can be etched the same or differently. Or, in other configurations, only one surface of the substrate sheet 302 may be etched. With the ability to etch each surface differently, there is the possibility of creating at the same time holes by aggressively etching a first surface and lightly etching the other surface. The processing of each surface of the substrate may also be staggered. The etch conditions may also be varied across the horizontal width of the substrate.

Not only does continuous etching affect the through-hole properties, but it can also affect the substrate sheet edges and overall mechanical reliability. Etching of the edges of the substrate sheet can eliminate or reduce flaws in the substrate sheet to thereby increase bend strength. Etching near the edges can also produce a rounded, tapered, or varying thickness edge profile. The etching process produces a thinning of the substrate sheet as well. This thinning can be uniform over the substrate sheet width or it could more aggressively create thinner regions in the substrate sheet for mechanical or device functionality purposes. These variations are possible by varying the etch conditions across the substrate surface or by masking techniques.

In alternative embodiments, the substrate sheet 302 may be separated into individual segments after the laser process. Rather than roll-to-roll processing, the individual segments of the substrate sheet 302 may be continuously passed through the etching assemblies described herein. In some embodiments, the substrate sheet 302 may enter the etching assembly 104 as an unrolled sheet, and then be rolled into a spool after passing through the etching assembly.

Figure 21:
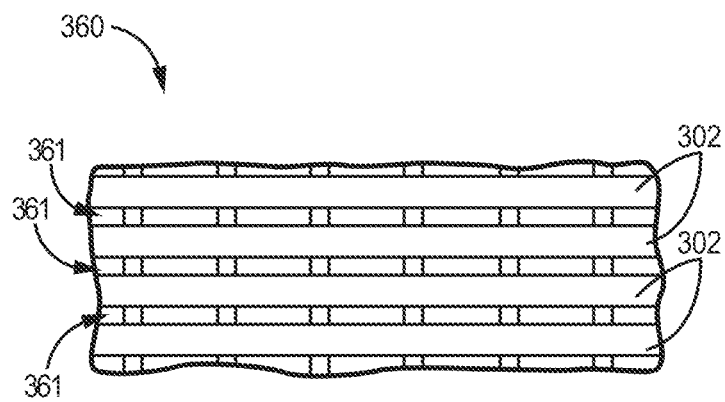
FIG. 21 is a schematic illustration of a partial view of a spool comprising a substrate sheet and an interleaf layer according to one or more embodiments described herein.
Figure 22:
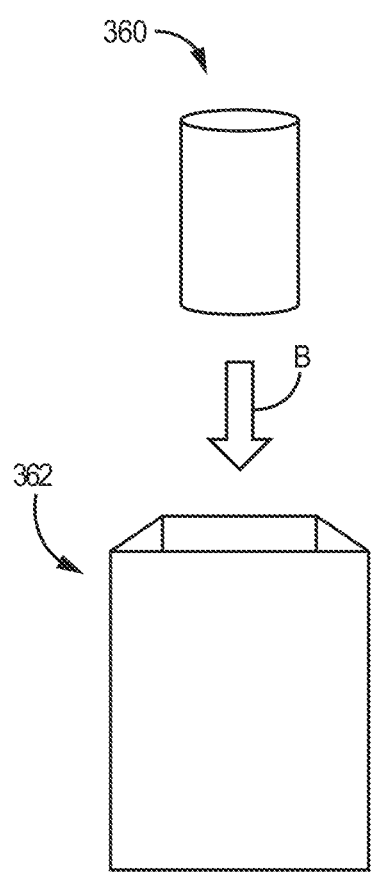
FIG. 22 is a schematic illustration of a spool comprising a substrate sheet and an interleaf layer being positioned within an etching assembly according to one or more embodiments described and illustrated herein.

Referring now to FIGS. 21 and 22, in some embodiments an entire spool 360 is etched in spool form following the laser process rather than by continuously passing the substrate sheet 302 through the etching assembly 352. FIG. 21 schematically illustrates a portion of a final spool 360 of a rolled substrate sheet 302. To ensure that etching solution reaches substantially all surface areas of the substrate sheet 302, a gap should be present between adjacent surfaces of the substrate sheet 302. As shown in FIG. 21, an etchant-resistant interleaf layer 361 is disposed between adjacent surfaces of the substrate sheet 302. The interleaf layer 361, which may be configured as a grid or otherwise comprise openings, provides for gaps between adjacent surfaces of the substrate sheet 302. This allows the etchant solution to flow in between the surfaces of the substrate sheet 302 when the final spool 360 is submerged in the etching solution. The interleaf layer 361 may be applied before or after the laser processing assembly 306. The final spool 360 may also include a plurality of substrate sheets and a plurality of interleaf layers.

After the passing through the laser processing assembly 306 and being rolled into the final spool 360 (or an intermediate spool), the substrate sheet 302 is placed into an etching assembly 362 as indicated by arrow B. The etching solution chemistry and etching duration will depend on the material of the substrate sheet 302 and the desired properties (e.g., hole diameter, substrate sheet thickness, and the like). The resulting product is a spool of a rolled substrate sheet having holes formed therein. After etching, the final spool 360 may be cleaned (e.g., aqueous cleaning or plasma cleaning) and/or subjected to further processing. For example, the final spool 360 may be easily packaged and shipped to another facility for further processing.

It should now be understood that embodiments described herein provide for a system and process of cutting and drilling in a target substrate uses a pulsed laser and an optical system to generate a line focus of the laser beam within the target substrate, such as a glass substrate sheet. The pulsed laser cutting and drilling system and process creates holes or defects that, in certain embodiments, extend the full depth of the glass sheet with each individual laser pulse, and allows the laser system to cut and separate the target substrate into any desired contour by creating a series of perforations that form a contour or desired part shape. Since a glass substrate sheet is brittle, cracking will then follow the perforated contour, allowing the glass substrate sheet to separate into any required shape defined by the perforations. The system and process can cut a multitude of glass compositions, ranging from high stress glasses (e.g. ion-exchanged) to low stress glasses (e.g. Corning EXG) at high speeds (>500 mm/s), allowing cutting complex shapes with tight radii and complex contours. In addition, the system and process can further be adapted to make a desired interposer pilot hole patterns in glass wafers. An acid etch process may also be used to enlarge the holes and turn these wafers into suitable glass interposers.

While exemplary embodiments have been described herein, it will be understood by those skilled in the art that various changes in form and details may be made therein without departing from the scope encompassed by the appended claims.

The invention claimed is:

1. A process of fabricating a substrate sheet, the process comprising:
    disposing the substrate sheet at a laser processing assembly comprising at least one laser operable to emit a laser beam, the substrate sheet being substantially transparent to the laser beam;
    focusing the laser beam into a laser beam focal line, viewed along a beam propagation direction of the laser beam;
    directing the laser beam focal line into the substrate sheet with a first laser process, the laser beam focal line generating an induced absorption within the substrate sheet, the induced absorption producing a defect along the laser beam focal line within the substrate sheet;
    translating the substrate sheet relative to the laser beam, thereby laser drilling a first plurality of defects and a second plurality of defects within the substrate sheet, wherein the second plurality of defects define a closed boundary and the first plurality of defects are disposed within the closed boundary; and
    after laser drilling the first plurality of defects and the second plurality of defects with the first laser process, separating at least one component piece of the substrate sheet along the closed boundary defined by the second plurality of defects using either a second laser process or etching, the second laser process comprising an infrared laser.

2. The process of claim 1 wherein the substrate sheet is selected from a group consisting of a glass substrate sheet, a glass-ceramic substrate sheet, fused silica, and a sapphire sheet.

3. The process of claim 1 wherein the second plurality of defects have a pitch of less than about 20 μm between defects forming the second plurality of defects.

4. The process of claim 1 wherein the first plurality of defects are less than about 10 μm in diameter and extend greater than about 100 μm in depth.

5. The process of claim 1 further comprising etching the first plurality of defects to enlarge the first plurality of defects.

6. The process of claim 5, wherein etching of the first plurality of defects occurs prior to separating at least one component piece of the substrate sheet along the closed boundary defined by the second plurality of defects.

7. The process of claim 1 wherein the first plurality of defects comprises holes having a diameter between about 10 μm and 120 μm and extending through the substrate sheet.

8. The process of claim 7 further comprising metallizing the first plurality of defect holes extending through the substrate sheet.

9. The process of claim 1 wherein the operation of separating the at least one component piece along the closed boundary defined by the second plurality of defects provides a serrated edge along at least one side of the at least one component piece.

10. The process of claim 9 wherein the serrated edge is formed by the second plurality of defects of the closed boundary, wherein an amplitude of a serration of the serrated edge is less than about 10 μm and a pitch of the serration is less than about 20 μm.

11. The process of claim 1 wherein the operation of creating the first plurality of defects is performed prior to the operation of creating the second plurality of defects.

12. The process of claim 1 wherein the operation of creating the second plurality of defects is performed prior to the operation of creating the first plurality of defects.

13. The process of claim 1 wherein a first optical head is adapted to provide the first plurality of defects and a second optical head is adapted to provide the second plurality of defects.

14. The process of claim 1 wherein the operation of disposing the substrate sheet at a laser processing assembly comprises providing the substrate sheet disposed about a roll.

15. The process of claim 1 wherein the laser beam of the first laser process comprises a pulsed laser beam.

16. The process of claim 1 wherein the substrate sheet has an absorption or scattering of a wavelength of the laser beam of less than about 10%.

17. The process of claim 1 further comprising metallizing the first plurality of defects to provide for electrical conductivity through the first plurality of defects.

18. The process of claim 1 wherein the laser beam of the first laser process has an average laser burst pulse energy measured at the substrate sheet greater than about 40 μJ, pulses having a duration in a range of between greater than about 1 picosecond and less than about 100 picoseconds, and a repetition rate in a range of between about 100 Hz and about 1 MHz.

19. The process of claim 1 wherein a plurality of component pieces are defined by a plurality of sets of the second plurality of defects that each define a closed boundary and a plurality of the first plurality of defects are disposed within each closed boundary.

20. The process of claim 1 wherein the laser beam of the first laser process is focused by a focusing lens and the laser beam irradiates the focusing lens in the form of an annulus.

21. The process of claim 1, wherein translating the substrate sheet relative to the laser beam further comprises laser drilling a third plurality of defects and a fourth plurality of defects, the fourth plurality of defects defining a closed boundary and the third plurality of defects are disposed within the closed boundary, and the closed boundary defined by the second plurality of defects has at least one of a different size or shape from the closed boundary defined by the fourth plurality of defects.

22. The process of claim 1, wherein the separating the at least one component piece of the substrate sheet along the closed boundary defined by the second plurality of defects uses etching.

23. The process of claim 1, wherein the second laser process uses a different laser than the first laser process.

24. The process of claim 1, wherein the infrared laser is a carbon dioxide laser.

* * * * *

UNITED STATES PATENT AND TRADEMARK OFFICE
CERTIFICATE OF CORRECTION

PATENT NO. : 11,186,060 B2
APPLICATION NO. : 15/205284
DATED : November 30, 2021
INVENTOR(S) : Kristopher Allen Wieland et al.

It is certified that error appears in the above-identified patent and that said Letters Patent is hereby corrected as shown below:

On the Title Page

In Column 2, item [56], Line 2, delete "-Wavelength" and insert -- =Wavelength --, therefor.

Page 6, in Column 2, item [56], Lines 64-65, delete "Eelectropolishing" and insert -- Electropolishing --, therefor.

Page 7, in Column 1, item [56], Line 56, delete "pluse" and insert -- pulse --, therefor.

Page 7, in Column 2, item [56], Line 49, delete "Engltsh" and insert -- English --, therefor.

Page 7, in Column 2, item [56], Line 50, delete "TnuchScreen" and insert -- TouchScreen --, therefor.

Page 8, in Column 2, item [56], Line 13, delete "publically" and insert -- publicly --, therefor.

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*